(12) United States Patent
Jacobson et al.

(10) Patent No.: US 6,517,995 B1
(45) Date of Patent: Feb. 11, 2003

(54) FABRICATION OF FINELY FEATURED DEVICES BY LIQUID EMBOSSING

(75) Inventors: Joseph M. Jacobson, Newton, MA (US); Colin A. Bulthaup, Boston, MA (US); Eric J. Wilhelm, Somerville, MA (US); Brian N. Hubert, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/525,734

(22) Filed: Mar. 14, 2000

Related U.S. Application Data

(60) Provisional application No. 60/153,776, filed on Sep. 14, 1999, and provisional application No. 60/167,847, filed on Nov. 29, 1999.

(51) Int. Cl.[7] .................................................. B31F 1/07
(52) U.S. Cl. ........................ 430/320; 430/322; 430/330; 438/455; 438/754; 101/28; 264/1.1; 264/1.24; 264/1.38; 264/2.3; 264/1.36; 510/175
(58) Field of Search ................................ 430/320, 322, 430/330; 438/455, 754; 101/28; 264/1.1, 1.24, 1.38, 2.3, 1.36; 510/175

(56) References Cited

U.S. PATENT DOCUMENTS

| | | | | |
|---|---|---|---|---|
| 5,009,708 A | * | 4/1991 | Grunwald et al. | 106/105 |
| 5,259,926 A | | 11/1993 | Kuwabara et al. | 156/659.1 |
| 5,368,789 A | * | 11/1994 | Kamitakahara et al. | 264/1.33 |
| 5,466,319 A | * | 11/1995 | Zager et al. | 156/220 |
| 5,900,160 A | | 5/1999 | Whitesides et al. | 216/41 |
| 6,027,595 A | * | 2/2000 | Suleski | 156/230 |

FOREIGN PATENT DOCUMENTS

| WO | WO 97/06468 | 2/1997 |
|---|---|---|
| WO | WO 00/30869 | 6/2000 |

OTHER PUBLICATIONS

Schueller, Olivier J.A., et al., "Fabrication of Glassy Carbon Microstructures by Soft Lithography" *Sensors and Actuators* A72 (1999), 125–139.

Schift, H., et al., "Nanostructuring of Polymers and Fabrication of Interdigitated Electrodes by Hot Embossing Lithography" *Microelectronic Engineering* 46 (1999), 121–124.

Colburn, M., et al. "Step and Flash Imprint Lithography: A New Approach to High–Resolution Patterning" Part of the *SPIE Conference on Emerging Lithographic Technologies III*, Santa Clara, California, Mar. 1999, SPIE vol. 3676, 379–389.

Shimoda et al., "Multicolor Pixel Patterning of Light–Emitting Polymers by Ink–Jet Printing," SID 99 Digest, 26.3, pp. 376–379, 1999.

Choi et al., "Late–News Paper: A 4.5–in. Fully Sealed Carbon Nanotube–Based Field–Emission Flat–Panel Display," SID 99 Digest, L2.1, pp. 1134–1137, 1999.

Schueller et al., "Fabrication of photonic crystal lasers by nanomolding of solgel glasses," Applied Optics, vol. 38, No. 27, pp. 5799–5802, Sep. 20, 1999.

(List continued on next page.)

Primary Examiner—Mark F. Huff
Assistant Examiner—Daborah Chacko-Davis
(74) Attorney, Agent, or Firm—Testa, Hurwitz, &Thibeault, LLP

(57) ABSTRACT

Elastomeric stamps facilitate direct patterning of electrical, biological, chemical, and mechanical materials. A thin film of material is deposited on a substrate. The deposited material, either originally present as a liquid or subsequently liquefied, is patterned by embossing at low pressure using an elastomeric stamp having a raised pattern. The patterned liquid is then cured to form a functional layer. The deposition, embossing, and curing steps may be repeated numerous times with the same or different liquids, and in two or three dimensions. The various deposited layers may, for example, have varying electrical characteristics, interacting so as to produce an integrated electronic component.

43 Claims, 13 Drawing Sheets

OTHER PUBLICATIONS

Tan, et al., "Roller nanoimprint lithography," J. Vac. Sci. Technol. B 16(6), pp. 3926–3928, Nov./Dec. 1998.

Wu et al., "Large area high density quantized magnetic disks fabricated using na–noimprint lithography," J. Vac. Sci. Technol. B 16(6), pp. 3825–3829, Nov./Dec. 1998.

Sun et al., "Multilayer resist methods for nanoimprint lithography on nonflat sur–faces," J. Vac. Sci. Technol. B 16(6), pp. 3922–3925, Nov./Dec. 1998.

Kim, et al., "Invited Paper: Thin–Film Micromirror Array (TMA) for Cost–Competitive Information–Display Systems," SID 99 Digest, 47.1, pp. 982–985, 1999.

* cited by examiner

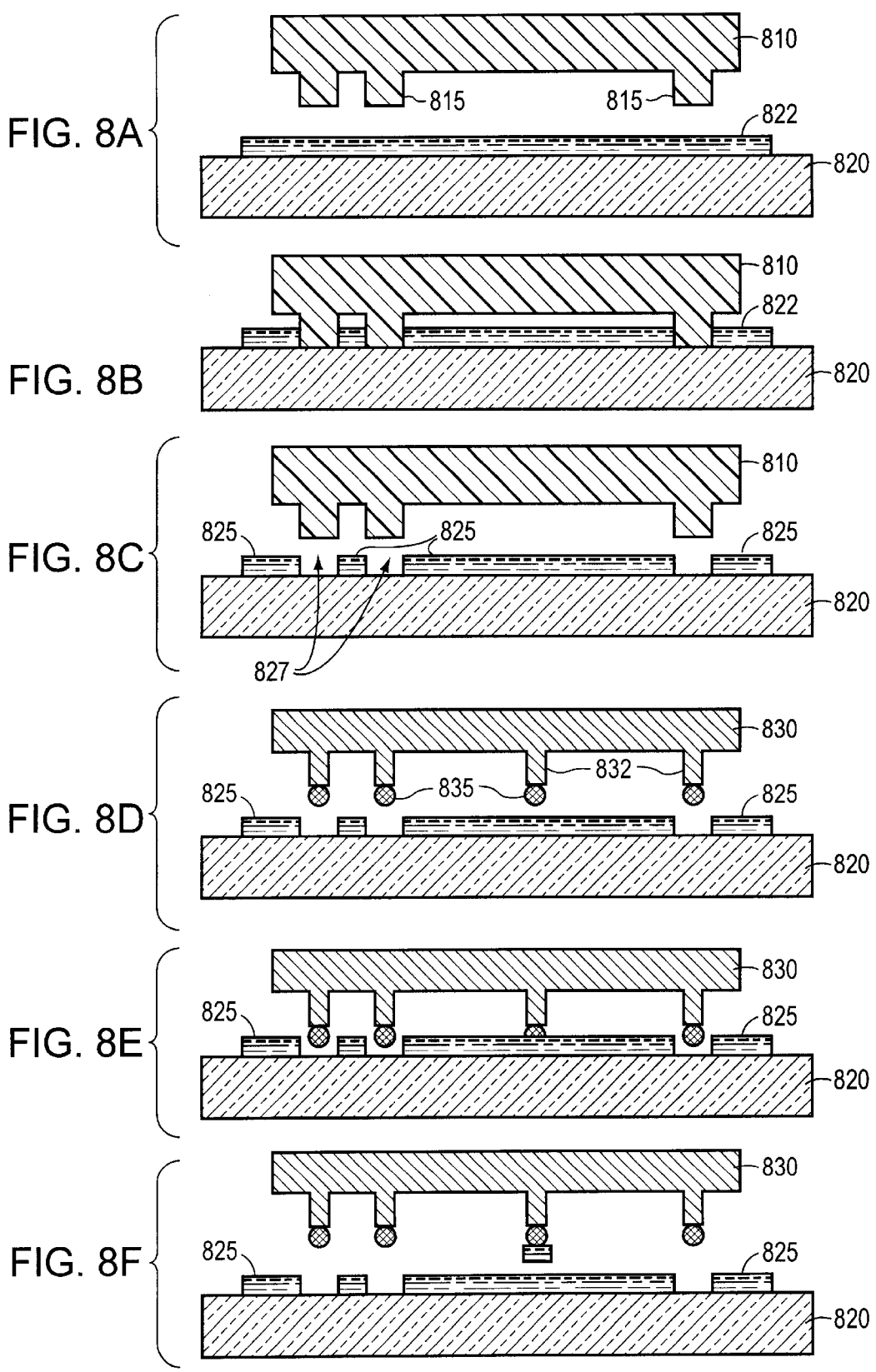

FABRICATION OF FINELY FEATURED DEVICES BY LIQUID EMBOSSING

PRIOR APPLICATION

This application stems from U.S. Provisional Application Serial Nos. 60/153,776, filed on Sep. 14, 1999, and No. 60/167,847, filed on Nov. 29, 1999.

FIELD OF THE INVENTION

The present invention relates to fabrication of finely featured electronic, chemical, and mechanical devices.

BACKGROUND OF THE INVENTION

Electronic and electromechanical components are presently fabricated in large, immobile manufacturing facilities that are tremendously expensive to build and operate. For example, semiconductor device fabrication generally requires specialized microlithography and chemical etching equipment, as well as extensive measures to avoid process contamination. The total amount of time required for processing of a single chip may be measured in days, and typically requires repeated transfer of the chip into and out of vacuum conditions.

In addition to their expense, the fabrication processes ordinarily employed to create electronic and electromechanical components involve harsh conditions such as high temperatures and/or caustic chemicals, limiting the ability to integrate their manufacture with that of functionally related but environmentally sensitive elements. For example, the high temperatures used in silicon processing may prevent three-dimensional fabrication and large-area fabrication; these temperatures are also incompatible with heat-sensitive materials such as organic and biological molecules. High temperatures also preclude fabrication on substrates such as conventional flexible plastics, which offer widespread availability and low cost.

Despite intensive effort to develop alternatives to these processes, no truly feasible techniques have yet emerged. U.S. Pat. No. 5,817,550, for example, describes a low-temperature roll-to-roll process for creating thin-film transistors on plastic substrates. This approach faces numerous technical hurdles, and does not substantially reduce the large cost and complexity associated with conventional photolithography and etching processes.

U.S. Pat. No. 5,772,905 describes a process called "nanoimprint lithography" that utilizes a silicon mold, which is pressed under high pressure and temperature into a thin film of material. Following cooling with the mold in place, the material accurately retains the features of the mold. The thin film may then be treated to remove the small amount of material remaining in the embossed areas. Thus patterned, the film may be used as a mask for selectively etching underlying layers of functional materials. This process is capable of producing patterns with very fine resolutions at costs significantly below those associated with conventional processes. But it is quite complicated, requiring numerous time-consuming steps to create a single layer of patterned functional material. The technique requires high application pressures and temperatures at very low ambient pressures, thereby imposing significant complexity with attendant restriction on the types of materials that can be patterned. Perhaps most importantly, this technique is limited to producing single-layer features, thereby significantly limiting its applicability to device fabrication.

U.S. Pat. No. 5,900,160 describes the use of an elastomeric stamp to mold functional materials. In particular, the stamp is deformed so as to print a self-assembled molecular monolayer on a surface. This process, also called MIMIC (Micromolding Against Elastomeric Masters), is significantly simpler than nanoimprint lithography, and can be performed at ambient temperatures and pressures. But the technique is generally limited to low-resolution features (in excess of 10 $\mu$m), and more importantly, the types of geometries amenable to molding by this technique are limited.

DESCRIPTION OF THE INVENTION

Objects of the Invention

It is, accordingly, an object of the present invention to provide an easily practiced, low-cost process for directly patterning functional materials without the need for multistage etching procedures.

Another object of the invention is to increase the speed with which layers of functional materials can be patterned.

Still another object of the invention is to provide a fabrication process that requires no unusual temperature, pressure, or ambient conditions, thereby increasing the range of materials amenable to patterning.

A further object of the invention is to facilitate convenient nanoscale patterning of multiple adjacent layers.

Yet another object of the invention is to planarize deposited materials as part of the application process, eliminating the need for additional planarizing processes (such as chemical mechanical polishing), thereby facilitating fabrication of complex three-dimensional devices employing many (e.g., in excess of 100) layers.

BRIEF SUMMARY OF THE INVENTION

To achieve the foregoing and other objects, the present invention utilizes an elastomeric stamp to facilitate direct patterning of electrical, biological, chemical, and mechanical materials. In accordance with the invention, a thin film of material is deposited on a substrate. The deposited material, either originally present as a liquid or subsequently liquefied, is patterned by embossing at low pressure using an elastomeric stamp having a raised pattern. The patterned liquid is then cured to form a functional layer. The deposition, embossing, and curing steps may be repeated numerous times with the same or different liquids, and in two or three dimensions. The various deposited layers may, for example, have varying electrical characteristics, interacting so as to produce an integrated electronic component.

BRIEF DESCRIPTION OF THE DRAWINGS

The foregoing discussion will be understood more readily from the following detailed description of the invention, when taken in conjunction with the accompanying drawings, in which:

FIGS. 8A–8F are sectional views illustrating fabrication of a biochip in accordance with the present invention;

DETAILED DESCRIPTION OF THE PREFERRED EMBODIMENTS

Figure 1A:
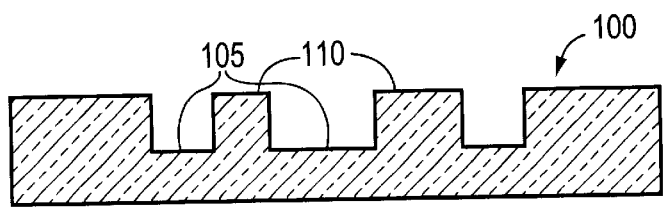
FIGS. 1A–1D are greatly enlarged sectional views illustrating fabrication of an elastomeric stamp in accordance with the present invention.

FIGS. 1A–1D illustrate an exemplary approach to fabricating an elastomeric stamp useful in the practice of the present invention. As shown in FIG. 1A, a substrate 100 is patterned with a series of recessed features 105 and projecting features 110. These features correspond in size and arrangement (but not in depth) to the pattern ultimately desired for a component layer. Accordingly, the features 105, 110 may be inscribed using conventional techniques such as photolithography, e-beam, focused ion-beam, micromachining, or other lithographic approaches. Feature sizes as small as 150 nm have been accurately obtained and utilized, although even smaller features are of course possible. Substrate 100 may, for example, be any surface sufficient smoothness that may be conveniently patterned, and which will not bond to the material from which the stamp is to be formed. Suitable materials include, for example, silicon, metal wafers, and exposed photoresist.

Figure 1B:
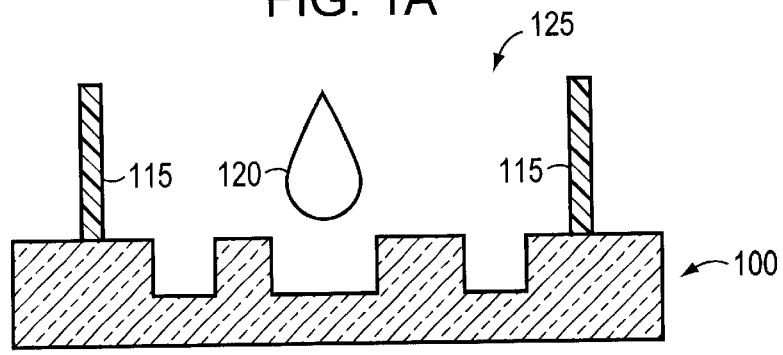
Figure 1C:
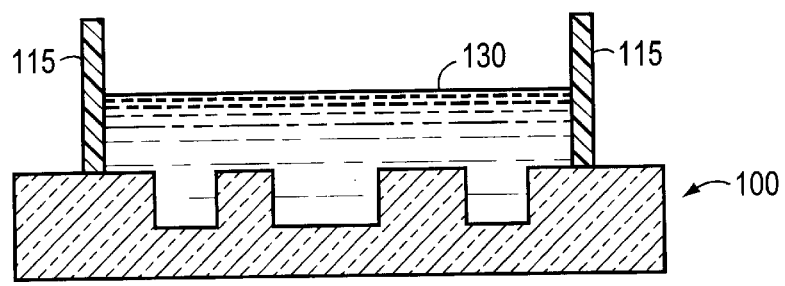

As shown in FIG. 1B, a raised enclosure 115 is applied to substrate 100 so as to surround the pattern of features 105, 110. Enclosure 115 may be, for example, a metal or plastic wall, the outer contour of which is designed to fit within the device that will apply the stamp as hereinbelow described. An uncured elastomer 120 in liquid form is poured into the well 125 formed by enclosure 115 and features 105, 110. Preferably, elastomer 120 is a curable rubber or silicone material such as polydimethylsiloxane (PDMS), e.g., the SYLGARD-184 material supplied by Dow Corning Co. To prevent seepage, enclosure 115 is desirably held against the surface of substrate 100 with a modest pressure or set within a conforming groove in substrate 100.

A sufficient amount of elastomer 120 is poured into well 125 to completely fill features 105 and to provide a stable body mass for stamping operations. The elastomer 120 is then cured into a solid plug 130. For example, the PDMS material mentioned above may be cured by heating in an oven at 80° C. for 2 h. Other silicone elastomers may be cured by exposure to moisture, e-beam or actinic (e.g., ultraviolet) radiation, or by addition of a cross-linking agent.

Figure 1D:
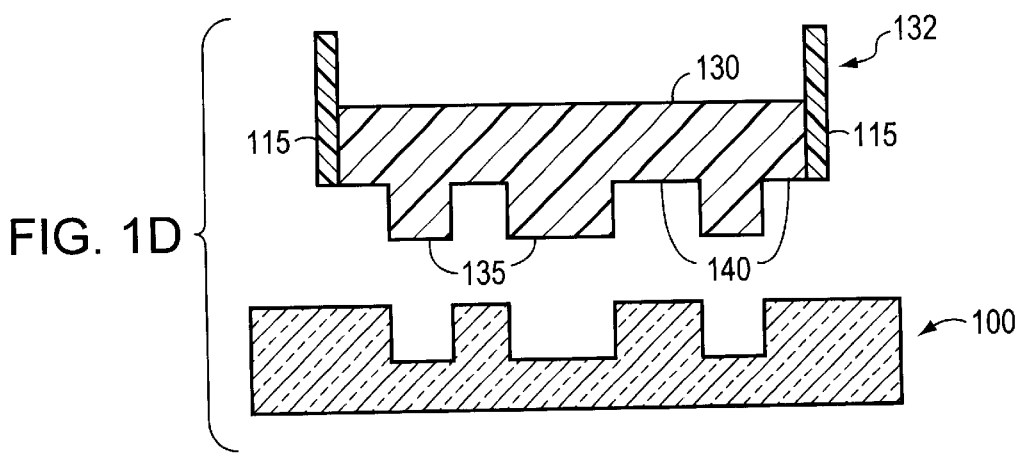

The solid plug 130 is separated, with or without enclosure 115, from substrate 100 as shown in FIG. 1D to form a finished stamp 132. The underside of plug 130 has a series of projecting and recessed features 135, 140 complementary to the features 105, 110 of substrate 100, which are left undamaged by the foregoing process steps; moreover, little if any elastomer is desirably left on the substrate 100 when plug 130 is removed.

Enclosure 115 may be removed along with plug 130 as shown in FIG. 1D, or it may instead be left in place on substrate 100. If it is removed and its association with plug 130 retained, it may serve several purposes: facilitating mechanical attachment to the stamping device, assisting with alignment of the stamp (for example, enclosure 115 may have an alignment tab that mates with a complementary recess in the stamping device), and limiting lateral deformation of plug 130. To further limit lateral deformation, plug 130 may be made relatively thin (by pouring the liquid elastomer 120 to a level not substantially above the surface of substrate 100) and capped by a solid support structure. A fenestrated film or other rigidity-conferring filler material may be added to liquid elastomer 120 prior to curing, thereby integrating within the resulting polymer matrix to further enhance the rigidity of plug 130.

Other techniques may also be used to fabricate the stamp 132. For example, a stamp may be patterned by selectively curing a thin film of the elastomer by exposure to actinic radiation through a mask followed by photochemical development (to remove the exposed or the unexposed areas), or by selective thermal curing with an atomic force microscope (AFM) thermal tip. The stamp 132 may also be fabricated from non-elastomeric stiff materials for better control of deformation. For example, the procedures described above can be carried out with a polyacrylate rather than an elastomer. Suitable polyacrylates include polyfunctional acrylates or mixtures of monofunctional and polyfunctional acrylate that may be cured by e-beam or ultraviolet (UV) radiation.

If the stamp 132 becomes soiled, it may be cleaned by coating the patterned surface with a liquid polyimide such as Japanese Synthetic Rubber, curing the polyimide in place, and then peeling it off the stamp. This process will remove dust and debris without harming the patterned stamp surface.

Figure 2A:
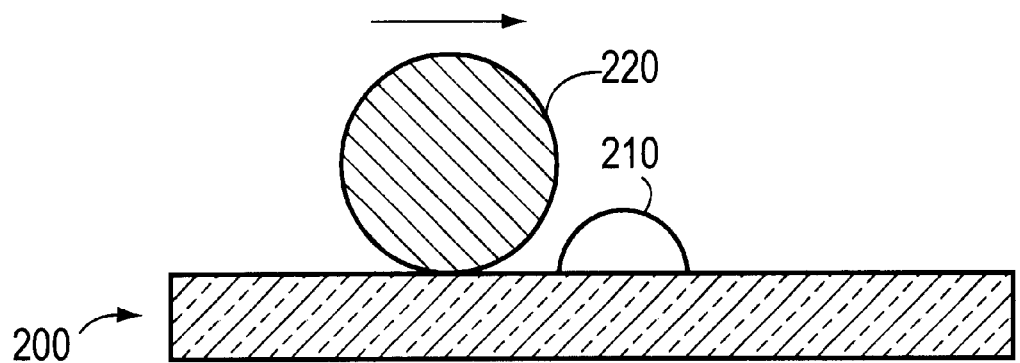
FIGS. 2A and 2B are side elevations illustrating application of a thin, uniform film of liquid onto a substrate.
Figure 2B:
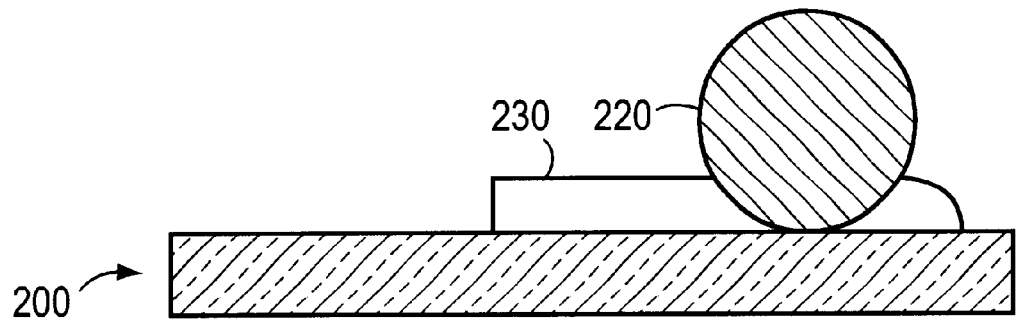

The stamp is applied to a liquid which, when cured, provides a desired electrical, chemical, biological, and/or mechanical functionality. For example, the liquid may be a colloidal dispersion of nanoparticles or carbon nanotubes; an uncured polyimide; a solution of biological material; or a solution of a suitable sacrificial or release layer which may later be dry- or wet-etched (e.g., PMMA). In general, the liquid is present on a substrate (or on a previously deposited and cured layer) as a thin, uniform film. A deposited liquid can be drawn into such a film by various techniques, one of which is illustrated in FIGS. 2A and 2B. A substrate 200— which may be a glass slide, a silicon wafer, a sheet of plastic, or other smooth material—receives a bead 210 of liquid. A smooth rod 220 (which may be glass or a flexible material) is dragged across substrate 200 in the direction of the arrow, drawing the bead 210 into a uniform film 230. In general, the pressure between rod 220 and substrate 200 can vary without affecting the resultant thickness of film 230; indeed, rod 220 can even be held slightly above substrate 200 (so that no contact is actually made). The speed with which rod 220 is drawn across substrate 200 does affect the thickness of film 230, however, with faster travel resulting in a thinner film. Accordingly, for a film of uniform thickness, rod 220 should be drawn at a constant speed, and should not be allowed to rotate as it is drawn. The film thickness is also affected by the size (diameter) of rod 220.

After rod 220 has been fully drawn across substrate 200, the film 230 will typically still be in a liquid state. Depending on the liquids substantial loss of volume may occur by evaporation; indeed, a loss of 90% of the initial height of the film is not unusual. Thus, a thin film of liquid initially 100±10 nm in height may dry down to a film 10±1 nm in height. We have routinely obtained dry films with heights less than 40 nm using this technique.

For some materials, the use of a rod to produce a thin film is not an option. For example, the material may not wet to the surface of substrate 200, or the solvent may evaporate almost instantly. An alternative application technique useful in such cases utilizes a stamp having a patterned surface as described above. A small line of the liquid material to be drawn into a film is deposited onto substrate 200. One edge of the stamp is brought into contact with substrate 200 immediately next to the line of liquid. The stamp is then lowered into contact with the substrate, displacing the liquid in front of it and producing a thin, patterned layer of material under the stamp.

Another alternative involves application of the material to be patterned as a droplet, either to the surface of the receiver substrate or to the raised-pattern surface of the stamp. The stamp is then brought into contact with the substrate surface, thereby molding the applied material in the pattern of the stamp. The material may be cured (e.g., thermally) with the stamp in contact with the substrate. For example, this approach has been applied to liquid-phase polyimide, vinyl, and nanoparticle metal inks, which are cured by activating a hotplate underlying the substrate following patterning. It is found, however, that this approach is most useful for insulators (such as polymers) because the resulting patterned film is contiguous. The process also works best with viscous materials that exhibit limited outgassing during cure (although PDMS stamps are to some degree porous to may outgassing components).

Figure 3A:
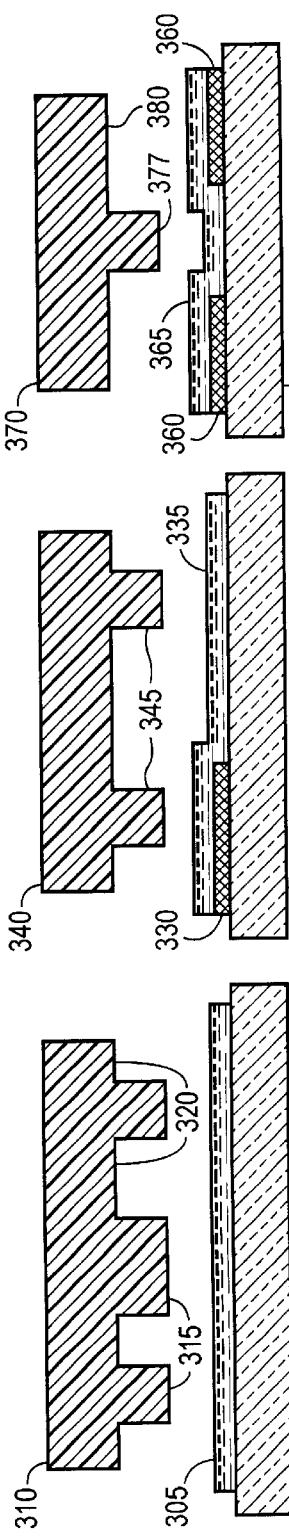
FIGS. 3A–3C and 3D–3F are sectional views illustrating, respectively, the embossing process of the present invention as applied to planar surfaces and non-planar surfaces.
Figure 3B:
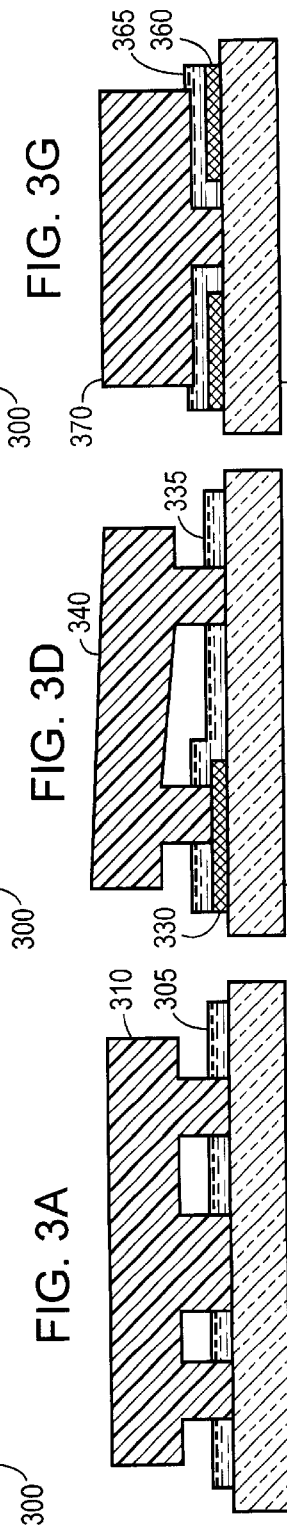
Figure 3C:
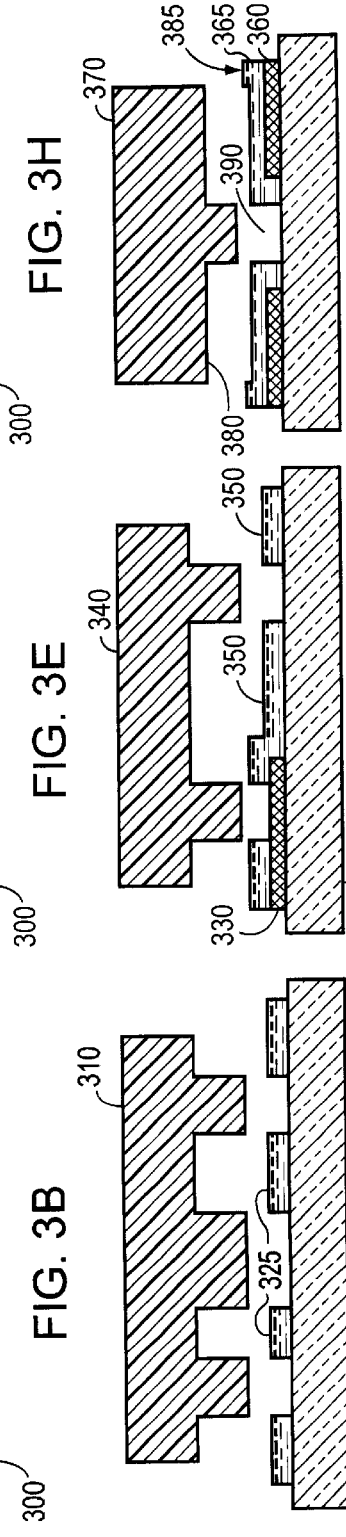

FIGS. 3A–3C illustrate the embossing technique of the present invention as applied to a planar surface. A substrate 300 is coated with a thin, uniform film 305 of liquid as described above. An elastomeric stamp 310 having a pattern of projecting and recessed features 315, 320 is lowered until the projecting features 315 make contact with substrate 300, thereby displacing liquid 305 at the regions of contact. The height (or heights) of the recessed features 320 exceeds that of the liquid that will be displaced therein. The area dimensions of projecting features 315 are constrained by the need for these features to push aside the liquid 305 and either make contact with substrate 300 or at least displace enough liquid to facilitate its convenient subsequent removal. The maximum areas of features 315 depend greatly on the viscosity of the liquid, the thickness of the film 305, and the nature of the stamp elastomer. For metallic nanoparticles in suspension (15%) with a wet film thickness of 500 nm, it has been found that an elastomeric stamp formed from PDMS can completely transport the nanoparticle-containing liquid over a distance greater than 5 $\mu$m. In order to enhance the transport capability of features 315, these may have convex, rather than flat, surfaces; for example, the features may be domed, peaked, or otherwise shaped to make contact with substrate 300 at a small region, progressively moving more liquid as stamp 310 is pressed against substrate 300 and the features 315 flatten.

Stamp 310 is preferably lowered onto substrate 300 using a slight rocking motion. Since the stamp is elastomeric, it may be slightly flexed so that one edge first makes contact with the substrate before the rest of the stamp rolls into place. This approach prevents or reduces the formation of air bubbles. No unusual pressure, temperature, or ambient conditions are necessary for the embossing process. Very light or no pressure is applied to the stamp 310 so the projecting features 315 penetrate the liquid film 305. Any attractive force between projecting features 315 and substrate 300 will assist with the transport of liquid into recesses 320, and may also allow pressure to be removed—so that features 315 merely rest against substrate 300—without sacrificing contact.

With the stamp 310 against substrate 300 as shown in FIG. 3B, the film 305 may be partially or completely cured. The curing mode is dictated by the nature of the liquid, and may include one or more process steps such as heating, evaporating a solvent (to which the elastomer of stamp 310 is permeable), UV exposure, laser annealing, etc. Stamp 310 is removed from substrate 300 as shown in FIG. 3C, leaving a pattern of fully or partially cured film traces 325 that correspond to the pattern of recesses 320. Preferably, stamp 310 is removed using a rocking motion. Smooth, uniform motion improves the quality of the pattern 325 and prevents damage thereto from minuscule bursts of air.

It is found that even if the liquid 305 is not cured while stamp 310 is in contact with substrate 300, it will tend nonetheless to retain the pattern 325 when stamp 310 is removed so long as the thickness of the liquid is sufficiently small. That is, there will be no detectable flow of liquid back into areas displaced by the projecting regions of stamp 310, probably due both to the absolute height of liquid 305 and the small contact angle between the liquid and substrate 300. Moreover, so long as the surface energies of the substrate 300 and the stamp 310 are sufficiently mismatched, there will be no withdrawal of substrate material by stamp 310. As a result, stamp 310 may be immediately reused without cleaning.

If uncured or partially cured, the patterned liquid 325 may at this point be cured into full solidity. In addition to the curing techniques discussed above, the absence of the stamp 310 facilitates such additional mechanisms as vacuum evaporation and chemical modification (e.g., by addition of a cross-linker). In this regard, it should be noted that the film patterned by the stamp 310 may begin as a solid rather than a liquid. For example, the film may be heated to decrease viscosity before stamp 310 is brought into contact therewith. Alternatively, stamp 310 may itself be heated to a temperature sufficient to melt the solid film upon contact.

Figure 3D:
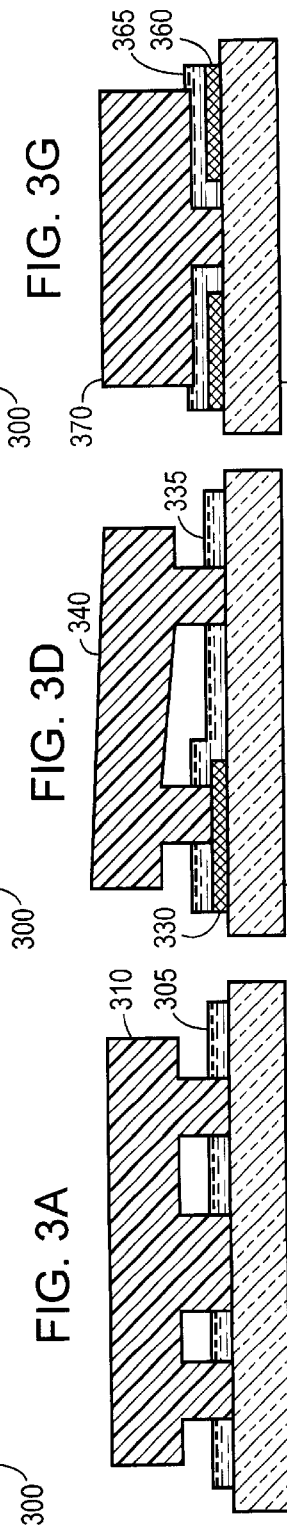

The film patterned by stamp 310 need not be planar; indeed, in constructions involving multiple deposited and patterned layers, coplanarity among layers may frequently be disrupted to achieve desired three-dimensional configurations. FIG. 3D shows a substrate 300 having a previously patterned layer of a first material 330. A thin film 335 of liquid is drawn over material 330 and, where exposed, substrate 300; the liquid 335 is generally conformal, resulting in an uneven liquid surface. Maintaining precise alignment among patterned layers is obviously vital to proper functioning of the finished device.

Figure 3E:
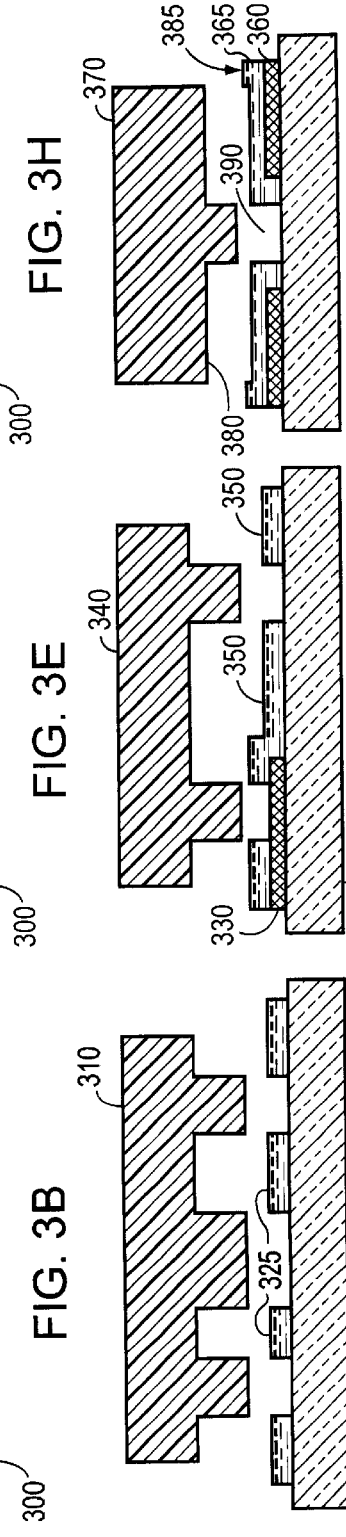
Figure 3F:
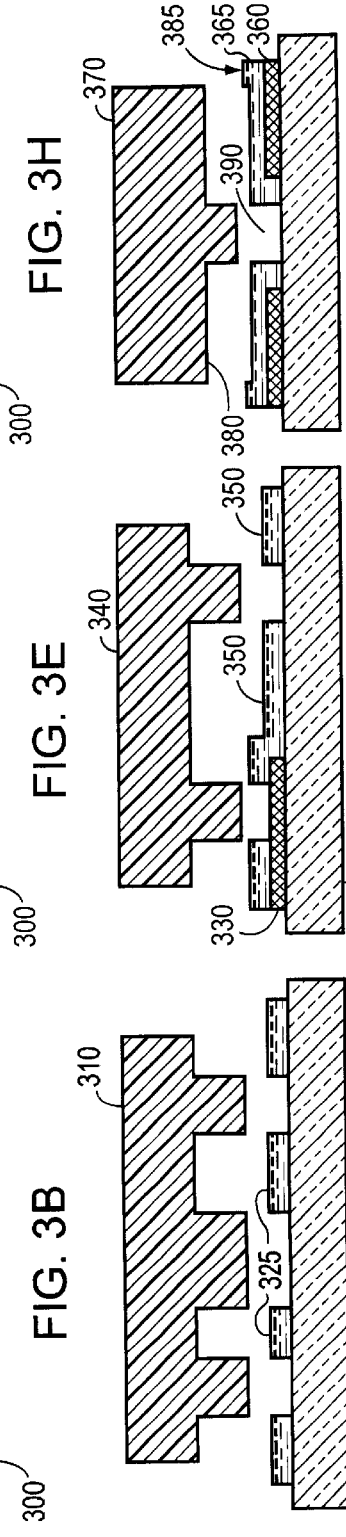

An elastomeric stamp 340 is well-suited to patterning such an uneven surface while maintaining precise rendition of the stamp pattern. As shown in FIG. 3E, stamp 340 is lowered as discussed previously. Because of its elastic character, stamp 340 deforms to allow different projecting features 345 to reach solid surfaces of different heights without substantial lateral deflection. As a result, the pattern 350 of material 335 that remains upon removal of stamp 340 is substantially complementary to the pattern of projecting features 345, notwithstanding the different heights of the embossed regions. Naturally, the degree of fidelity to the stamp pattern depends on the degree of elasticity inherent in the stamp and the differences in height that must be accommodated.

Following removal of stamp 340, the embossed pattern of material 350 is cured. Of course, the curing mode chosen must not damage the previously cured layer 330.

Figure 3G:
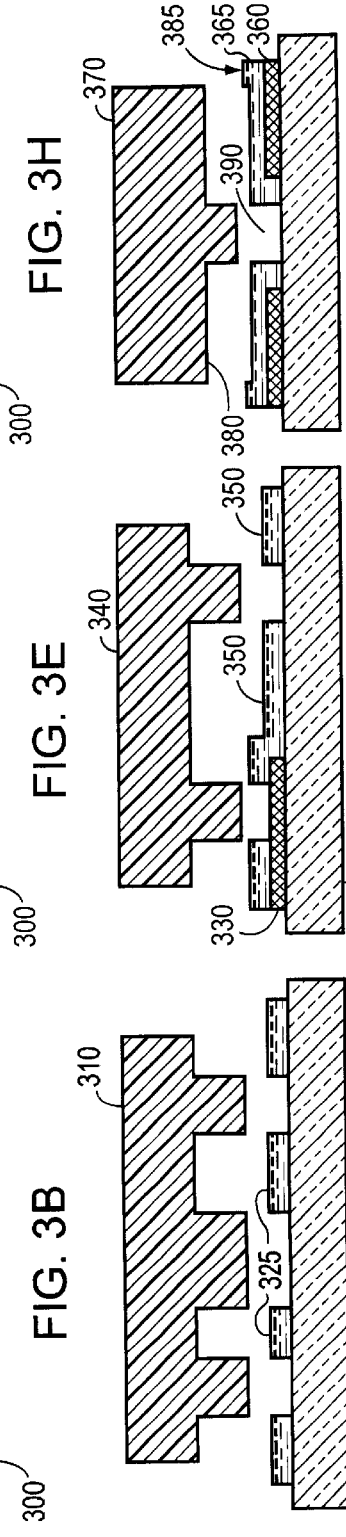
FIGS. 3G–3I are sectional views illustrating planarization and the creation of vias using the present invention.

As explained above, a thin film of deposited may be conformal, resulting in a surface of varying heights (rather than filling recesses to create a planar surface). The embossing technique of the present invention can be used not only to planarize such deposited layers, but also to create "vias" that interconnect layers not directly in contact with each other. With reference to FIG. 3G, a substrate 300 is patterned with a previously deposited and embossed layer of a first material 360. A thin film 365 of liquid is drawn over material 360 and, where exposed, substrate 300; once again the liquid 365 is generally conformal, resulting in an uneven liquid surface. In many applications, it is desirable for the component layer formed from liquid 365 to be planar rather than conformal. For example, planarization is essential for micro-electromechanical (MEM) structures and many-layer three-dimensional circuits. The present invention can accomplish both planarization and the creation of vias among non-adjacent stratified layers.

Figure 3H:
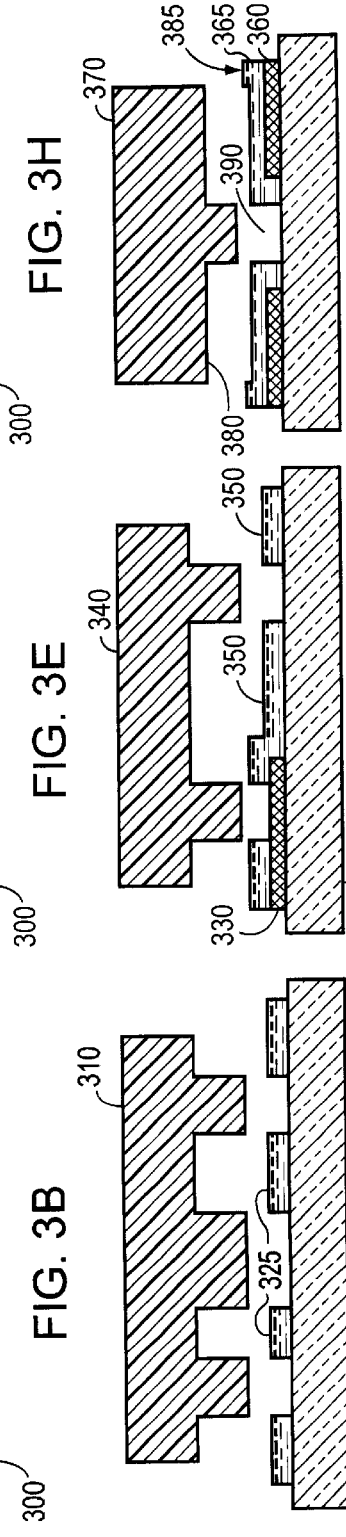
Figure 3I:
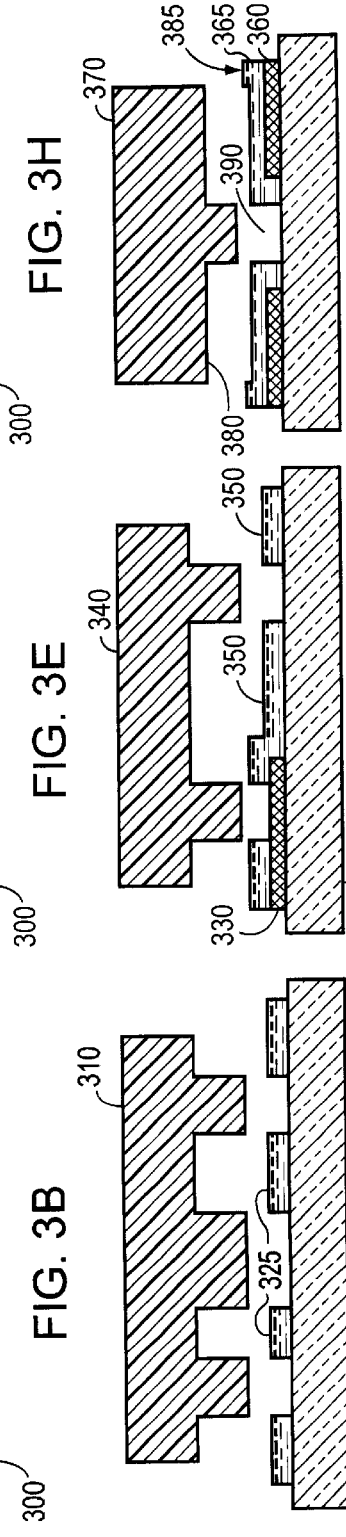

As shown in FIG. 3G, the projecting features of a stamp 370 (representatively indicated at 375) have elevations chosen such that, with the surfaces 377 of the projections in contact with substrate 373, the recessed portions of stamp 370 (representatively indicated at 380) make contact with the surface of liquid 365. As shown in FIG. 3H, the result is planarization of the liquid layer 365 where it is in contact with stamp surfaces 380. When stamp 370 is removed (FIG. 3I), that layer substantially planar with the exception of edge ridges shown at 385. Moreover, a via 390 is established between the surface of substrate 300 and the top surface of layer 365. A layer subsequently deposited on layer 365, therefore, can make contact with substrate 300, and this subsequently deposited layer can also be planarized in the manner just described. Alternatively, the via 390 can be made to persist through multiple layers by embossing with a similar projecting feature as each such layer is applied. In this way, contact between distant layers may be effectuated.

If the elevation of projecting features 377 is insufficient, there will be no contact with substrate 300 and via 390 will not form. If the elevation of projecting features 377 is excessive, then liquid 365 will not fully planarize; via 390 will effectively be stepped, with an intervening ridge or shoulder. Nonetheless, the latter sizing error is preferable, since the via 390 will be functional and, moreover, the configuration shown in FIG. 3I can still be achieved by compression of features 375 (if substrate 300 can tolerate some applied pressure).

Liquid 365 may or may not be cured (totally or partially) before stamp 370 is withdrawn in the manner hereinabove described. Following curing, the liquid 365 may decrease in height, jeopardizing planarity. This problem can be overcome by applying additional layers of the same material and embossing with the same pattern of features 377, 380. The ability to planarize and pattern in the same step represents a significant fabrication capability and improvement over the prior art.

The foregoing approach, in which a stamp is made a from master and then used repeatedly, may not be suitable for all applications. An alternative arrangement utilizes a device which, under computer control, is capable of changing its surface topology in accordance with a desired pattern and then acting as a stamp. Such a device may be built, for example, using an array of MEM elements that are actuated electrostatically, thermally, magnetically, piezoelectrically or by other computer-controllable means, actuation of an element causing it to alter the degree or manner in which it projects from the surface of the array. One such device useful in the present application is a micro-mirror array in which an array of elements is caused to tilt either out of plane or lie flat depending on an electrical signal (see Kim et al., *Society for Information Display* 99 *Digest*, p. 982 (1999)).

The approach of the present invention can be used to create arbitrary functional devices. The technique is negative-working, in the sense that the pattern of projecting features corresponds to the material that will be removed rather than deposited. This design methodology is apparent from FIGS. 4A–4F and 5A–5F, which illustrate fabrication of a two-transistor electronic inverter Each of FIGS. 4A–4F is a section taken from the corresponding one of FIGS. 5A–5F along the line labeled with the figure number. Functional layers are built up on a substrate 400 (FIGS. 4A, 5A), which may be, for example, a glass slide, a plastic sheet, a silicon wafer, or any other material having a sufficiently smooth surface 400s. Each added layer is patterned by a different stamp.

Figure 4A:
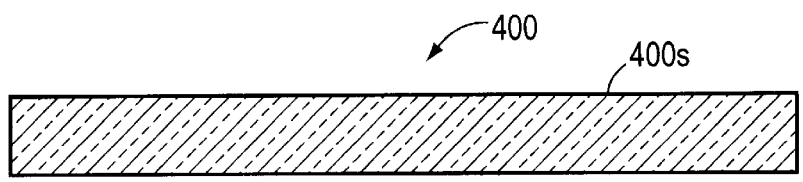
FIGS. 4A–4F are sectional views illustrating fabrication of an electronic inverter in accordance with the present invention.
Figure 4B:
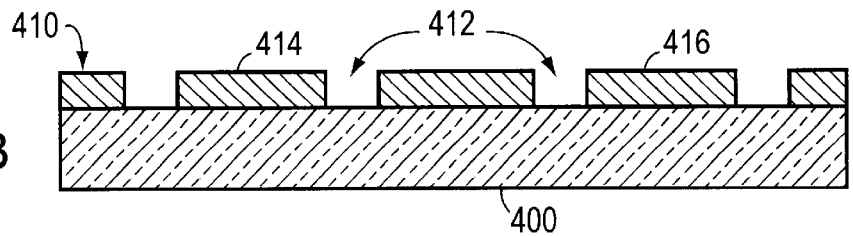
Figure 4C:
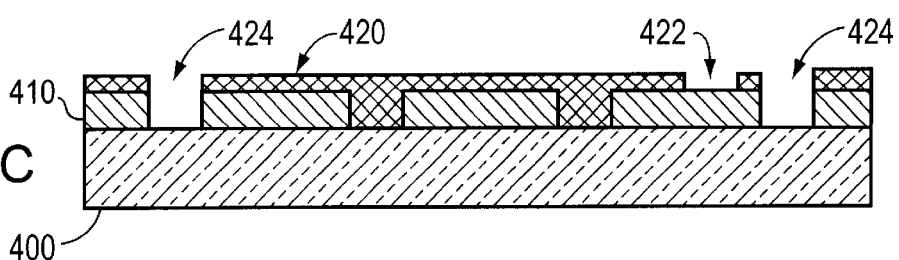
Figure 5A:
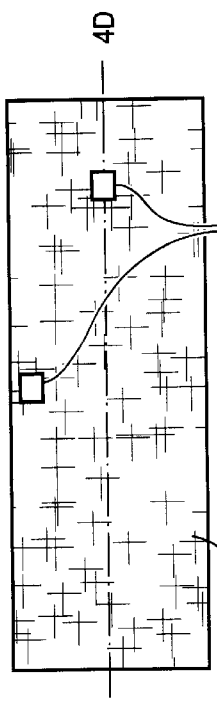
FIGS. 5A–5F are plan views of the structures shown sectionally in FIGS. 4A–4F.
Figure 5B:
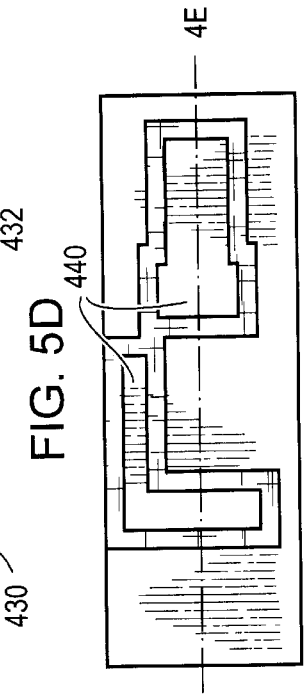
Figure 5C:
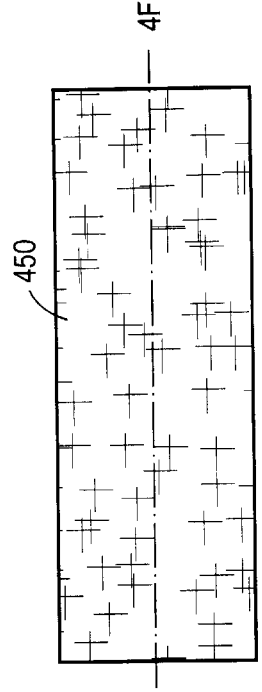

As shown in FIGS. 4B, 5B, a patterned conductive metal layer 410 is established on surface 400s of substrate 400. This is accomplished by first applying a thin film of a metal-containing liquid, such as a suspension of gold or silver nanoparticles in a suitable carrier liquid (see, e.g., U.S. Pat. No. 5,756,197, the entire disclosure of which is hereby incorporated by reference). The applied liquid is patterned with a stamp as described above so as to create a series of channels that reveal the surface 400s of substrate 400. The liquid is then cured (e.g., in the case of a metal nanoparticle suspension, the carrier is evaporated so that the metal particles coalesce into a substantially continuous, conductive patterned film). The pattern formed includes a pair of transistor gaps 412, a ground rail 414, and a $V_{cc}$ rail 416.

A semiconductive layer 420 is deposited onto the conductive layer 410. Layer 420 completely fills and is planarized over the channels 412, so that in these locations, layer 420 is in contact with substrate 400. Otherwise, the pattern of layer 420 substantially matches that of layer 410 so that the semiconductor 420 does not bridge between metal lines. In some areas 422, layer 420 is removed by the embossing process to reveal the underlying layer 410, while in other areas 424 overlying channels previously defined through layer 410, substrate 400 is revealed. Semiconductive layer 420 may be applied as a liquid suspension of semiconductor (e.g., silicon, germanium, CdSe, etc.) nanoparticles as described, for example, in U.S. Pat. No. 5,534,056 (the entire disclosure of which is hereby incorporated by reference). Again, following patterning, the layer may be cured by evaporating the carrier so as to coalesce the particles into a continuous patterned film.

Figure 4D:
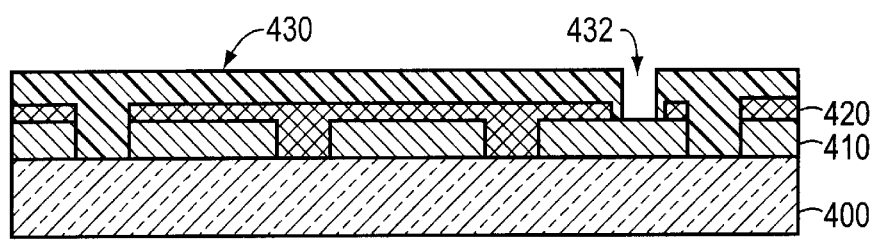
Figure 5D:
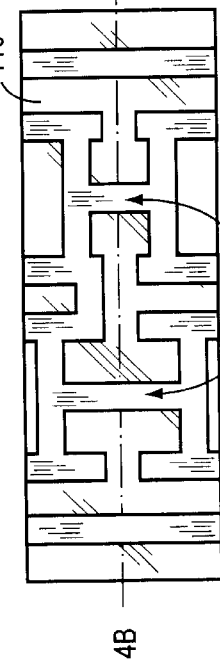

An insulating layer 430 is applied over semiconductive layer 420 as shown in FIGS. 4D, 5D. Layer 430 completely fills the vias 424, and is planarized thereover. A via 432, slightly smaller in diameter than the via 422 (see FIG. 4C) created earlier, is formed through that via 422 to reveal layer 410. The insulating layer may be applied as an uncross-linked liquid polymer precursor, such as a radiation-cure coating (polyacrylates and polymethacrylates, for example, are suitable for this purpose). Following patterning and removal of the stamp, the polymer precursor may be cured (i.e., cross-linked) into solidity by exposure to UV or e-beam radiation.

Figure 4E:
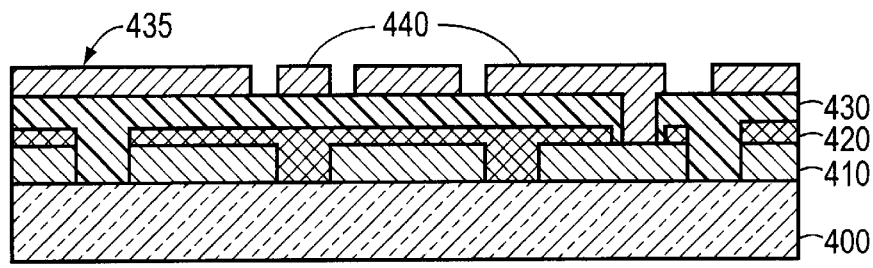
Figure 4F:
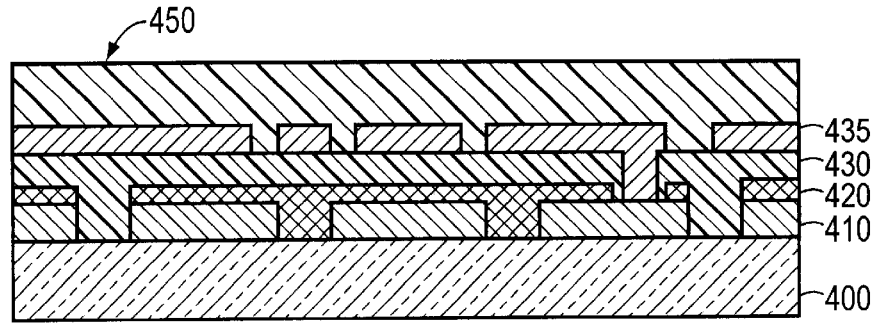
Figure 5E:
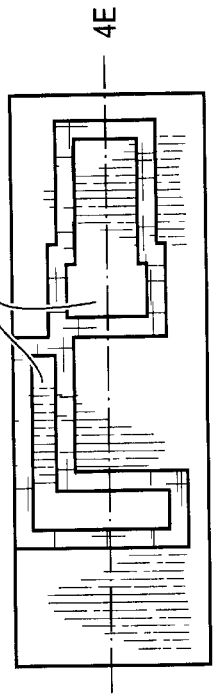
Figure 5F:
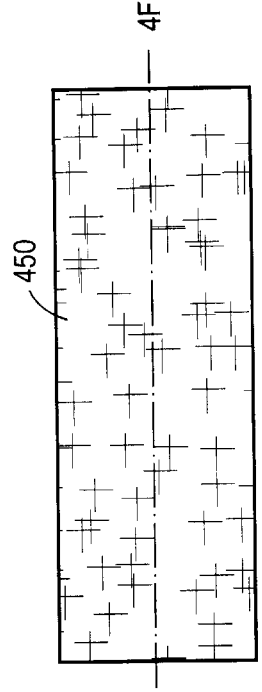

With reference to FIGS. 4E, 5E, a second metal layer 435 is applied to insulating layer 430 and patterned by stamping.

A plug of the metal layer 435 completely fills the via 432 created previously and connects to metal layer 410; because via 432 has a smaller diameter than via 424, a layer of insulating material separates the plug of metal from semiconductor layer 420 within the via 432. The second metal layer 430 forms the gates 440 of the two transistors.

An encapsulant 450, such as a UV-cured polymer, epoxy or spin-on glass is applied as a coating over layer 435 to protect all underlying functional layers from contamination or physical damage. The encapsulant, which is applied at a sufficient thickness to fill all exposed channels, also adds structural rigidity to the finished device.

FIGS. 6A–6G and 7A–7G illustrate fabrication of a freely rotating MEM wheel. Each of FIGS. 6A–6G is a section taken from the corresponding one of FIGS. 7A–7G along the line labeled with the figure number. The structure includes a first sacrificial or release layer, a second sacrificial or release layer, a first metal layer, a third sacrificial or release layer, and a second metal layer. After all layers are applied, a final release step etches away the release layers to liberate a purely metallic structure. Each layer is patterned using an elastomeric stamp as described above.

Figure 6A:
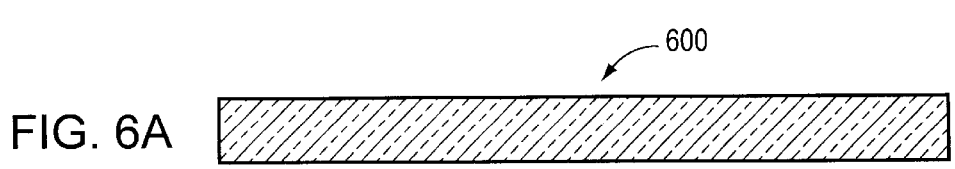
FIGS. 6A–6G are sectional views illustrating fabrication of a microelectromechanical device in accordance with the present invention.
Figure 6B:
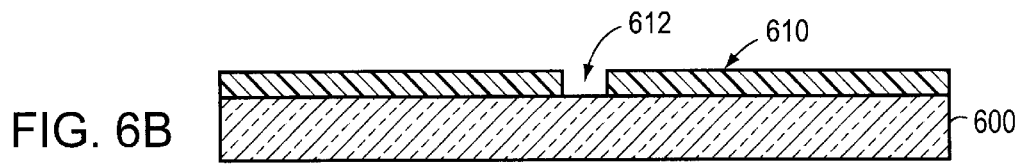
Figure 6C:
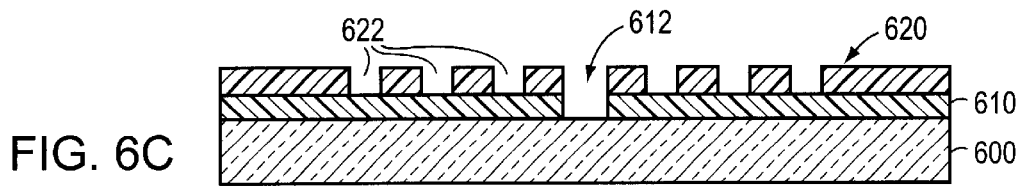

A substrate 600 (FIGS. 6A, 7A), which may be a glass slide, a plastic sheet, a silcion wafer, or any other appropriately smooth surface (for MEM applications a relatively stiff substrate may be desirable), receives a first release layer 610 as shown in FIGS. 6B, 6C. Release layer 610 may be, for example, a polymer (such as PMMA) soluble or wet-etchable in a solvent (such as acetone), or etchable by dry-etch techniques (such as plasma etching); or may be a spin-on glass etchable in hydrofluoric acid. Release layer 610 completely covers substrate 600 with the exception of a hole 612 patterned in the release layer by means of the elastomeric stamp. This hole 612 will receive material for the axle of the wheel.

Figure 7A:
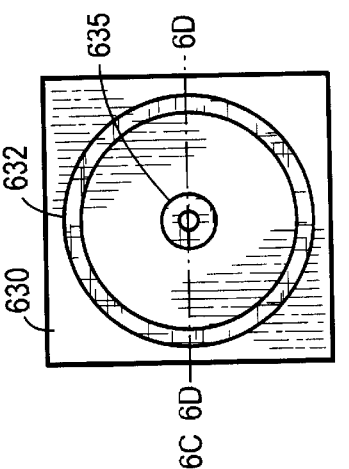
FIGS. 7A–7G are plan views of the structures shown sectionally in FIGS. 6A–6G.
Figure 7B:
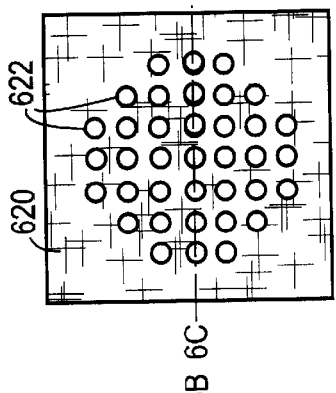
Figure 7C:
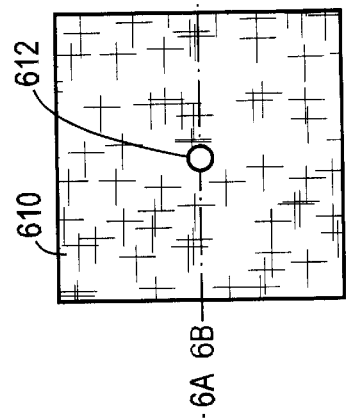

The second release layer 620 is patterned as shown in FIGS. 6C, 7C. The pattern includes a series of depressions 622. These will be filled with metal to create dimples on the rotating wheel. The hole 612 is patterned in the center of layer 620.

Figure 6D:
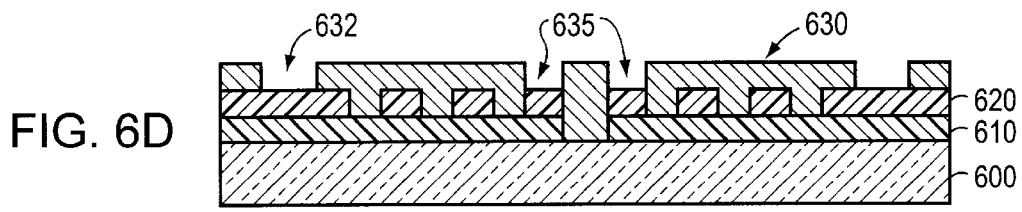
Figure 7D:
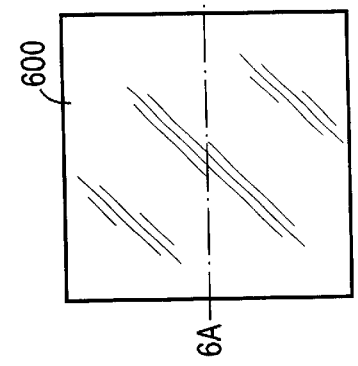

With reference to FIGS. 6D, 7D, the first metal layer 630 fills the holes 612, 622 (see FIG. 6C) patterned in the first two release layers 610, 620. Layer 630 is planarized over these holes. Stamping eliminates metal from a pair of concentric circular regions 632, 635. Region 632 defines the edge of the wheel, and region 635 faciliatates separation of the wheel from the axle. The bottom of the wheel fills the depressions 622 (FIGS. 6C, 7C), forming dimples that will reduce stiction between the wheel and substrate 600. Not shown are small holes patterned in the wheel to allow etchant to reach the underlying release layers 610, 620.

Figure 6E:
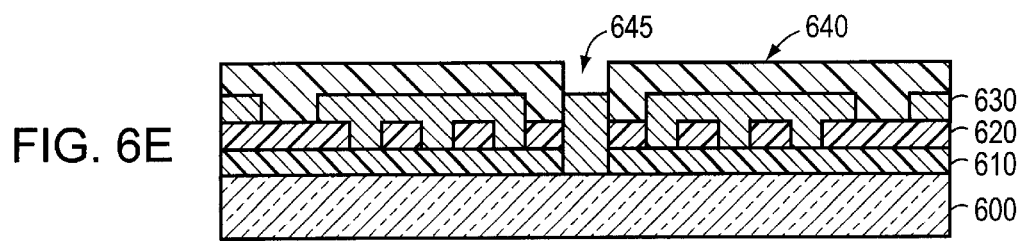
Figure 6F:
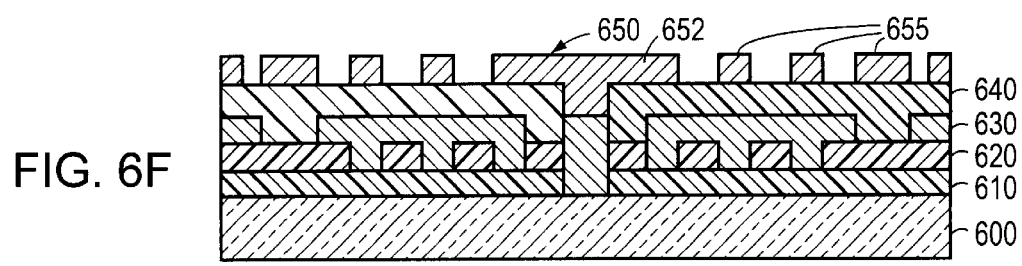
Figure 7E:
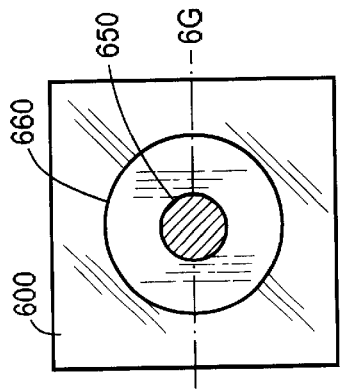
Figure 7F:
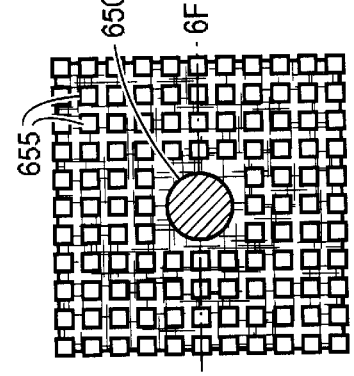

The third release layer 640 is added and patterned as shown in FIGS. 6E, 7E. This layer uses a stamp identical to that employed to pattern the first release layer 610, forming a hole 645 in the center for the axle of the wheel.

The second metal layer 650 (FIGS. 6F, 7F) is patterned to create a cap 652 on the axle of the wheel. This cap prevents the wheel from leaving the axle after all release layers are etched away. Metal layer 650 is also crosshatched to create small islands 655 of metal. These islands represent excess material and will be removed when the release layers are etched away, but are included to facilitate separation of the release layers. During the release step it may be necessary to use a supercritical $CO_2$ release to avoid suckdown problems between the wheel and the substrate.

Figure 6G:
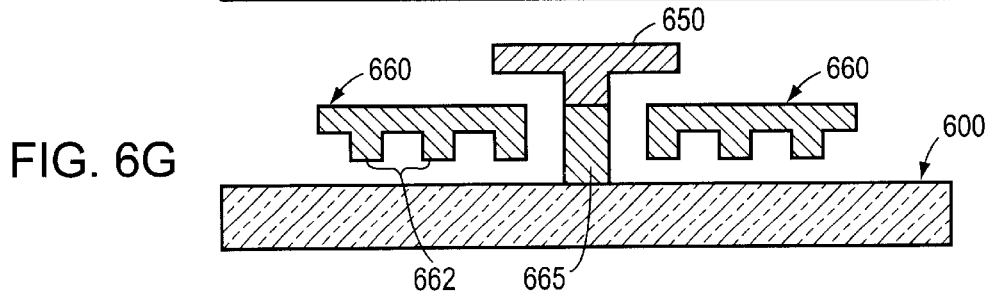
Figure 7G:
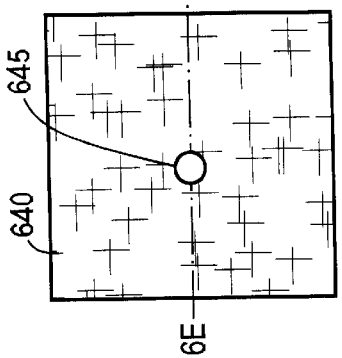

After the release layers 610, 620, 640 are etched away by exposure to a suitable solvent, the device assumes the configuration shown in FIGS. 6G, 7G. The finished device is a wheel 660 with dimples 662 on its bottom surface, an axle 665 about which the wheel 660 is free to rotate, and a cap 650 that holds the wheel 660 in place on the axle 665.

Other MEM structures amenable to production using the present invention include, for example, so-called heatuators, linear comb drives, and combustion engines.

FIGS. 8A–8F illustrate use of the present invention to create a so-called "biochip," i.e., an electronically active or readable substrate having a dense array of different biological materials (e.g., DNA probes, protein probes, carbohydrates). Such a chip can be used, for example, to identify samples of interest or to test for the presence of various molecular sequences. See, e.g., U.S. Pat. Nos. 5,605,662, 5,874,219, 5,744,305 and 5,837,832. If a sufficiently large array of different oligonucleotides can be deposited onto a surface, then one may in principle obtain full genome sequence information via the method of sequencing by hybridization (Skiena et al., *Proc. 36th Ann. Symp. on Foundations of Comp. Sci.,* pp.613–20 (1995)). As shown in FIG. 8A, an elastomeric stamp 810 has a series of projecting features 815. A substrate 820 has deposited thereon a thin film of biological material 822.

Stamp 810 is lowerd until projecting features 815 penetrate and displace the liquid film 812 to make contact with the underlying substrate 820 (FIG. 8B). The stamp 810 is then removed from contact with the substrate 810, leaving a pattern 825 of biological material and a complementary pattern of regions 827 from which biological material has been removed (FIG. 8C).

FIG. 8D shows a second substrate 830 having an array of projecting features 832 each with a biological receptor 835 bonded thereto. This biological receptor uniquely bonds to constituents of the biological material 822; for example, biological material 822 may be a protein solution, and the receptor 835 an antibody specific for the protein. The second substrate 830 is aligned above the original substrate 820.

The second substrate 830 is brought into contact with substrate 820 (FIG. 8E); some of the projecting features 832 overlie biological material 825, while others overlie voids 827. Biological material binds to receptors attached to projecting features that penetrate the liquid, while projecting features brought into contact with (or proximity to) void areas 827 remain unmodified. FIG. 8F shows the second substrate 830 removed from contact with substrate 820. Biological material on the original substrate was selectively transferred to certain projecting features 832 of the second substrate 830 and not to others; the second substrate 830, thus selectively patterned (with features 832 on the order of 10 nm–100 82 m) and chemically reacted, may serve as a biochip. The liquid material remaining on the original substrate 820 may be used to produce additional biochips.

If desired, the biochip may be brought into contact with a third substrate having a different biological material, and which has been patterned with the original stamp 810 or with a different stamp. In this way, a second layer of biological material can be selectively added to various of of the projecting features 832.

In an alternative approach, a biological resist layer is patterned by an elastomeric stamp in accordance with the invention, and is then brought into contact with a substrate having projecting features. The resist material binds selected projecting features based on the respective patterns of the features and the resist. The entire structure is then immersed in a functional biological material, which binds only to projecting features that have not received resist. Finally, the structure is immersed in an etch bath that removes the resist material (and any biological material that may have bound to it), but leaving undisturbed biological material bound to features that did not receive resist.

In a second alternative, biological material may be directly transferred from the projecting features of the elastomeric stamp onto selected sites (e.g., raised features) on the substrate. Areas of the stamp corresponding to recessed features do not transfer material. In this fashion the substrate may be patterned without the need for an intermediate transfer step. Spreading of the transferred material is avoided by maintaining only a very thin film of material in the plate from which the stamp is "inked." It is important, of course, that the receiver surface exhibit a higher affinity for the biological material than the stamp. PDMS has a very low surface energy, making it ideal for transferring a wide range of materials.

It should be stressed that this "direct pattern transfer" approach to patterning can be employed in connection with materials other than biological liquids. For example, a metal nanoparticle dispersion may be applied as a thin film to a flat surface such as glass or plastic. A patterned elastomeric stamp is brought into contact with the film of material and withdrawn, and the material adhering to the stamp transferred to a second surface. Using this technique, we have obtained conducting structures with edge resolutions on the order of 300 nm.

Existing methods for making DNA chips, such as described in U.S. Pat. No. 5,744,305, are limited in resolution and in requiring DNA arrays to be constrained to planar and non-porous surfaces. Using the stamping methods of the present invention and standard nucleotide chemistry (such as that used in gene-assembly machines), a DNA biochip may be fabricated in which nucleotides are added one base unit at a time to build up an array of spatially separated oligonucleotides that differ in their sequences as a function of location. For example, chemical synthesis of DNA can be accomplished by sequential addition of reactive nucleotide derivatives. Each new nucleotide in the sequence is first blocked by reaction with 4',4'dimethoxytrityl (DMT) and then combined with a highly reactive methylated diisopropyl phosphoramidite group, which links the nucleotide with the one previously added. The blocking group is removed by detritylation, which renders the newly linked nucleotide available for linkage to a further nucleotide. When synthesis is complete, all methyl groups are removed by exposure to alkaline pH.

Similarly, by employing the standard chemistries used in protein-assembly machines (e.g., repeated sequences of chemically blocking an amino acid, activation, linkage to the most recently added amino acid, followed by unblocking), carbohydrate-assembly machines, protein or carbohydrate biochips may be fabricated. In such biochips it may be desirable to have good separation between biological domains (such as between oligonucleotides of different sequence). This may be accomplished by stamping such sequences onto a non-planar or porous surface. In this context, the term "porous" refers to non-planar features that physically separate unique nucleotide sequences (or other chemically distinct biomolecules). For example, each sequence may be patterned on the top surface of a raised pillar, each of which is physically separated from its neighbors. This design allows for convenient removal unwanted chemistries, since these can be continuously withdrawn as they accumulate at the bases of the pillars. Alternatively, each nucleotide sequence may be deposited into a separate recessed well.

The stamping process of the present invention can be efficiently deployed to produce repetitive circuit patterns in two or three dimensions using a single set of stamps. FIG. 9A schematically illustrates a single SRAM 900 circuit with a power rail $V_{cc}$ 910 and a ground rail 915. The SRAM 900 is addressed using a horizontal control line 920 and a vertical control line 925 which, when both high, activate the split-gate transistor structure 930 and connect the read/write line 935 to the memory cell. The volatile memory is stored in a pair of cross-coupled inverters 940. This circuit can be fabricated using the embossing technique with five different elastomeric stamps: two metal layers, a semiconducting layer, a thin insulating layer, and a planarizing layer with vias.

Figure 9B:
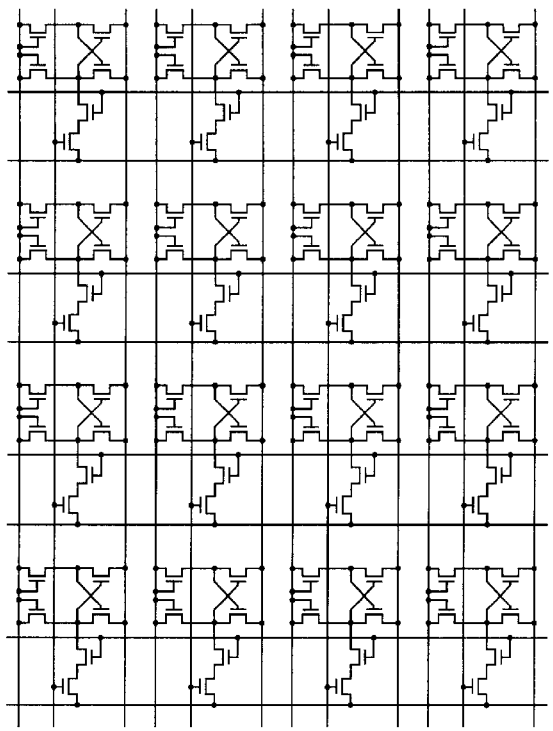
FIGS. 9A–9C schematically illustrate, respectively, a single SRAM circuit, a two-dimensional array of such circuits, and a three-dimensional array of such circuits.
Figure 9A:
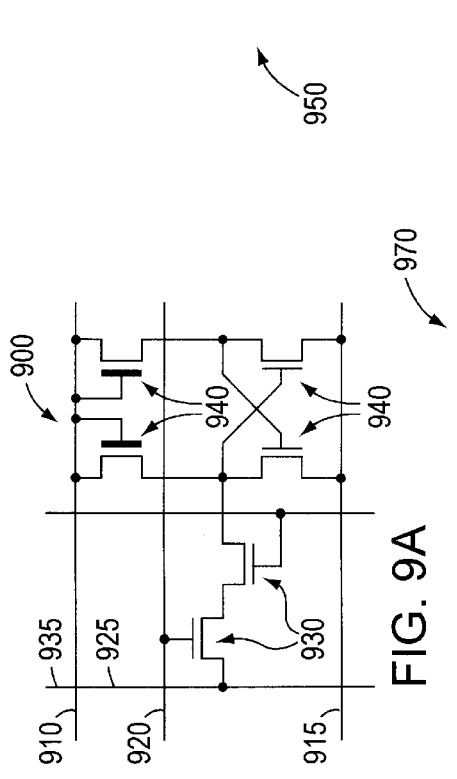

FIG. 9B shows the manner in which the basic circuit 900 can be utilized as a "tile" in a two-dimensional array of such circuits. In the figure, the circuit 900 is replicated 16 times in a contiguous, 4×4 two-dimensional array 950. This memory array 950 has power and ground rails, the horizontal control lines running along the left and right edges 955, and the vertical control lines and read/write lines running along the top and bottom edges. The array 950 is produced by applying, in the pattern of the array, the same five stamps over each applied layer. The stamped regions interact to form the continuous circuit 950.

Figure 9C:
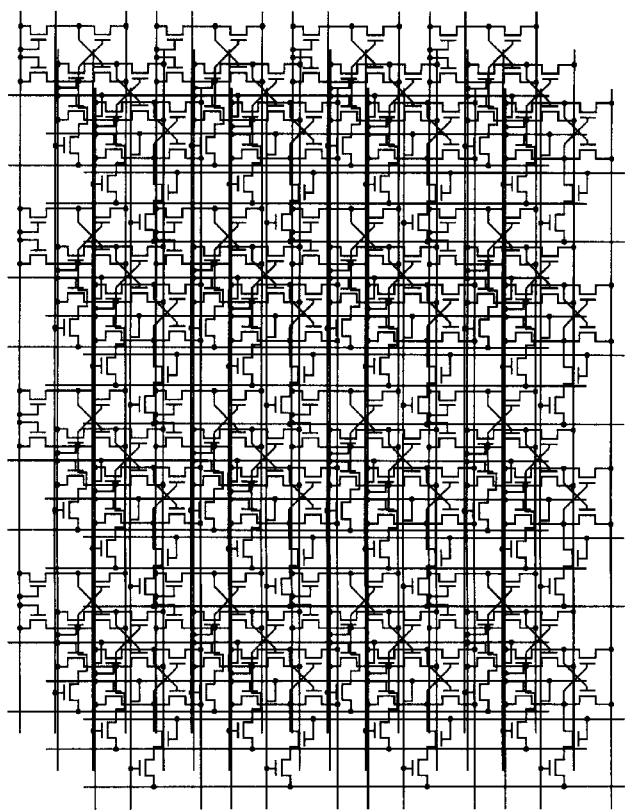

As shown in FIG. 9C, the array can be extended into three dimensions by replicating the two-dimensional array 950 in a vertical stack 970. A memory address is divided so that the first bits of the address decode into a set of horizontal control lines that all lie in the same two-dimensional position but are stacked vertically, and the last bits of the address decode the vertical control lines in the same way. In this fashion a word of memory is stored in the same two-dimensional position of different arrays in the vertical stack (so that the number of bits in a word of data corresponds to the number of vertically stacked memory arrays). The decoding circuitry on the edges of the memory may also be produced using the same five masks repeated for each layer with vias interconnecting the layers.

This approach is well-suited to construction of so-called "cellular automata," which are interconnected processing cells that interact with neighbors to compute in parallel. Cellular automata are often used to simulate three-dimensional environments, but conventional approaches are inherently two-dimensional and therefore limited in processing capacity. By creating circuits in three dimensions with many layers, it is possible to overcome this scaling limitation. A cellularautomata device would include many two-dimensional arrays of cells stacked vertically to create an interconnected three-dimensional array.

Another example of three-dimensional devices amenable to fabrication in accordance with the present invention is a neuronal structure consisting of many individual electronic "neurons" (each represented by a processor) arranged in three-dimensions with many "dendritic" interconnects between neighboring devices. Each neuron is affected by all of its surrounding neurons and in turns affects the neurons to which it is connected. Neural networks created in three-dimensions avoid many of the scaling problems that plague today's two-dimensional circuits.

Another application of the stamping process of the present invention involves creation of electron-emission structures for use in field-emission displays (FEDs). Today, these devices are typically fabricated in silicon and are quite expensive and complicated to produce; the most common structure used is a Spindt-tip. Recently, research has shown that by using materials with a lower work function (e.g., single-wall carbon nanotubes), much simpler structures can be fabricated with equal or better efficiency than typical silicon emitters (Choi et.al., *Society for Information Display 99 Digest*, p. 1134 (1999)). Unfortunately, the growth temperatures for producing nanotubes are well above the melting point for glass or plastic substractes (exceeding 800° C.) and have thus not been integrated with processes employing such substrates.

Figure 10A:
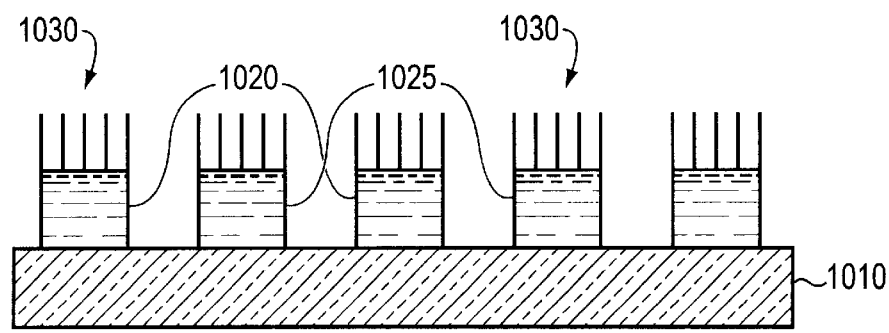
FIGS. 10A and 10B are sectional views illustrating fabrication of a field-mission display device in accordance with the present invention.

In accordance with the present application, a slurry of metallic (preferably gold) nanoparticles and chopped up nanotubes (nanopipes) is dissolved in a solvent. As shown in FIG. 10A, this slurry is then patterned, by stamping, onto a substrate 1010 (e.g., a glass sheet) as sets 1020, 1025 of interdigitated lines; some carbon nanotubes 1030 will protrude from the surfaces of the lines 1020, 1025. Through any of various available techniques (e.g., application of an electric field, or exploiting the flow of the liquid as the stamp is released), these nanotubes may be positioned to all point in the same directions. Lines 1020, 1025 are then cured at temperatures below 300° C.

Figure 10B:
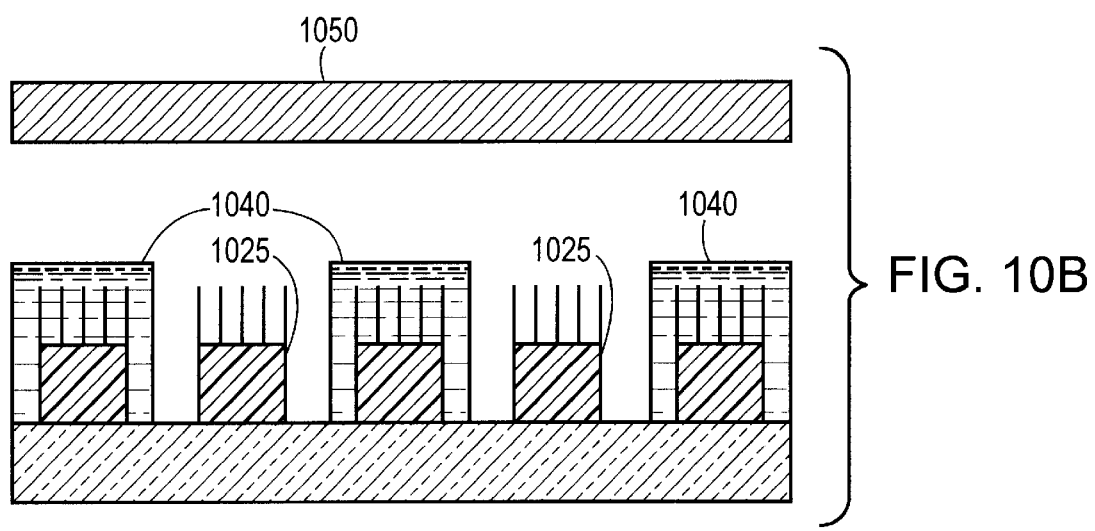

With reference to FIG. 10B, another layer 1040 of the nanoparticle slurry is applied so as to completely cover one set of lines 1020, thereby fully enclosing the carbon nanotubes. This set of lines 1020 represents the gate of the FED, whereas the set of lines 1025 represents the cathode. In operation, a phosphored anode 1050 is disposed proximately and in opposition to lines 1020, 1025, and a high vacuum established between anode 1050 and substrate 1010. Two parameters govern the operation of the FED: the voltage between the anode 1050 and the cathode lines 1025 ($V_{ac}$), and the voltage between the gate lines 1020 and the cathode lines 1025 ($V_{gc}$). The FED is either on or off. To set the FED to the "on" state, $V_{ac}$ is set to about 20V and $V_{gc}$ is set to 0V; electrons will stream from the cathode lines 1025 to the anode 1050 due to the low work function of the carbon nanotubes, but electrons will not stream from the gate lines 1020 to the anode 1050. To set the FED to the "off" state, $V_{ac}$ remains at about 20V but $V_{gc}$ is set to 5V; the electrons from cathode lines 1025 will then stream to the gate lines 1020 and no electrons will stream to the anode 1050. A visual display is caused by selective, line-by-line activation of the cathode lines 1025 to cause electron streaming therefrom.

In another application, the stamping process of the present invention may be combined with existing chip-fabrication processes. For example, the current high-end microprocessor production process can be divided into two major steps: the "front-end" processing, which consists of all steps necessary to produce a working transistor (e.g., silicon growth, gate oxide, doping, transistor fabrication); and the "back-end" processing of the wafer that creates the metal interconnects and vias which establish connections among the transistors. For high-end chips there may be a total of 30 mask sets, 18 for front-end processing and 12 for back-end processing; the complexity and cost of a chip is generally determined by the number of mask sets employed in its fabrication.

In accordance with the present invention, stamping is used to produce the metal back end for an otherwise typically fabricated silicon-wafer front end. A wafer is produced using standard silicon front-end processes up until the point when metal would first be deposited. Then, instead of evaporating aluminum and applying it using plasma etching, CPVD, CMP, Damascene planarization, and/or the other traditional processes (which tend to be expensive, lengthy, difficult, and wasteful), layers of metallic nanoparticles are patterned by nanoscale embossing to form the interconnect layers; in particular, a thin film of a metal nanoparticle solution is applied (e.g., by a spin-on technique) onto the wafer, and the film is patterned by embossing as described above to form metal interconnects and to fill the vias to underlying layers. The conducting traces thus formed are cured, and a layer of a dielectric nanoparticle material is deposited thereon. This layer is then embossed to pattern vias between metal layers, and then cured. The steps of depositing, patterning, and curing conductive and insulating layers are repeated until the desired number of layers is attained.

This approach offers advantages in terms of cost, time, waste, and difficulty of production; but, in addition, it also has the advantage of being self-planarizing. As a result, each layer of dialectric can be planarized through the stamping process, so that it is possible to create many more layers than can be obtained using current, conventional processes. In addition, since the stamping process is conformal to underlying layers, the quality of the planarization is not critical (as is the case, for example, in pholithography, where each layer must be planar to within a few hunder nanometers).

Still another application the stamping process of the present invention is fabrication of organic light emitters, organic logic, and organic transistors. Organic light emitters and logic materials such as PPV (poly(p-phenylene vinylene) and thiophene are difficult to pattern using standard lithographic processes because the etch process can degrade the organic material. One alternative approach is to use ink jet (Shimoda et al., *Society for Information Display 99 Digest*, p. 376 (1999)), but the resolution of this process is limited to above 10 μm. The stamping process described herein facilitates patterning of significantly finer features.

Yet another application of the stamping process of the present invention is patterning of optical waveguides. An optical waveguide is a structure in which a first region possesses a first index of refraction and a second region possesses a second index of refraction. A very simple optical waveguide may be made by simply embossing a rectangular ridge in an optically transparent material (such as spin-on glass or UV optical polymer) surrounded by air. Light directed into one end of the ridge will emerge at the other end. By combining such printed optical waveguides with printed light emitters such as organic electroluminescent materials, inorganic electroluminescent materials or hybrid electroluminescent materials and with printed detectors (such as phototransistors or photodiodes) and switches (such as electro-optical switches), it is possible to construct an "all-printed" or partially printed switching fabric for control of incoming optical signals and transmission of output-optical signals for various optical-telecommunications applications.

Figure 11:
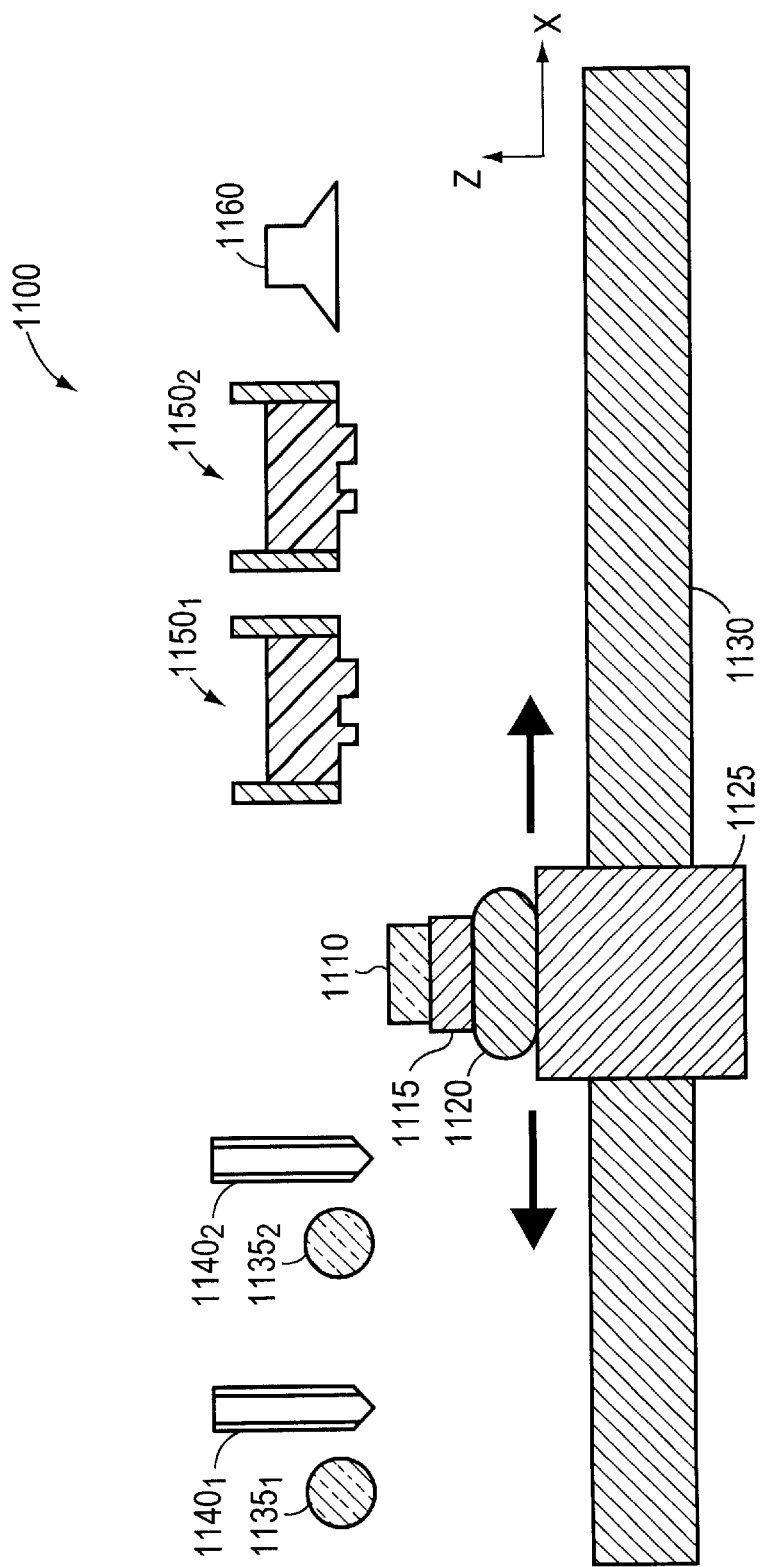
FIG. 11 is a block diagram of a preferred nano-embossing system implementing the present invention.

FIG. 11 shows a block diagram of a preferred nano-embossing system, indicated generally at 1100. The system operates on a substrate 1110, which is secured to a Z-translation stage 1115. The Z-translation stage is secured to a 360° C. theta stage 1120, which rotates in the XY plane. Theta stage 1120 is itself secured to a carrier 1125 on a gantry system 1130 adapted for two-dimensional movement in the XY plane. These components can transport substrate 1110 to any spatial position within the limit of movement, and with arbitrary XY rotation. A series of functional modules are suspended above substrate 1120, each module performing a different step in the embossing process: depositing thin films of material on the substrate, patterning the thin film, and curing the film following embossing.

In particular, thin films of liquid are produced on substrate 1110 by a metal rod 1135$_1$ and an ejection device 1140$_1$ (e.g., an ink jet head or pipet) that deposits a small amount of liquid as described above in connection with FIGS. 2A, 2B. Additional sets of metal rods and ejection devices (representatively indicated at $1135_2$, $1140_2$) are available for deposition of different liquids. The deposited liquid films are patterned by an elastomeric stamp, which may be selected from a plurality of available stamps representatively shown at $1150_1$, $1150_2$. The stamps are each retained within a suitable stamping press (not shown), the outer contours of the stamps fitting within complementary recess within the stamping equipment.

The patterned films are cured by a device 1160 (e.g., a thermal lamp, a UV lamp, a laser, etc.) as appropriate to the film. The substrate 1110 travels back and forth between these different modules and an aribtrary number of layers may be patterned thereon. Alignment of these different modules with respect to substrate 1110 can be accomplished, for example, using optical fiduciary marks as commonly used for silicon mask alignment. In addition, fine-grained alignment of the stamps 1150 may be performed using physical self-alignment of the stamp. For example, each stamp 1150 may contain deeply recessed triangular features that merge with raised alignment features on the substrate 1110. The stamp itself is preferably capable of translation and rotation during alignment.

Alternatively, a nano-embossing system in accordance with the present invention may comprise a "roll-to-roll" process facilitating continuous production of functional devices. A roll-to-roll process resembles conventional letterpress printing processes, with the stamps of the present invention configured as elastomeric letterpress plates. A plate is rotated on a drum, making gentle contact with a moving substrate onto which the curable liquid has been deposited.

Figure 12A:
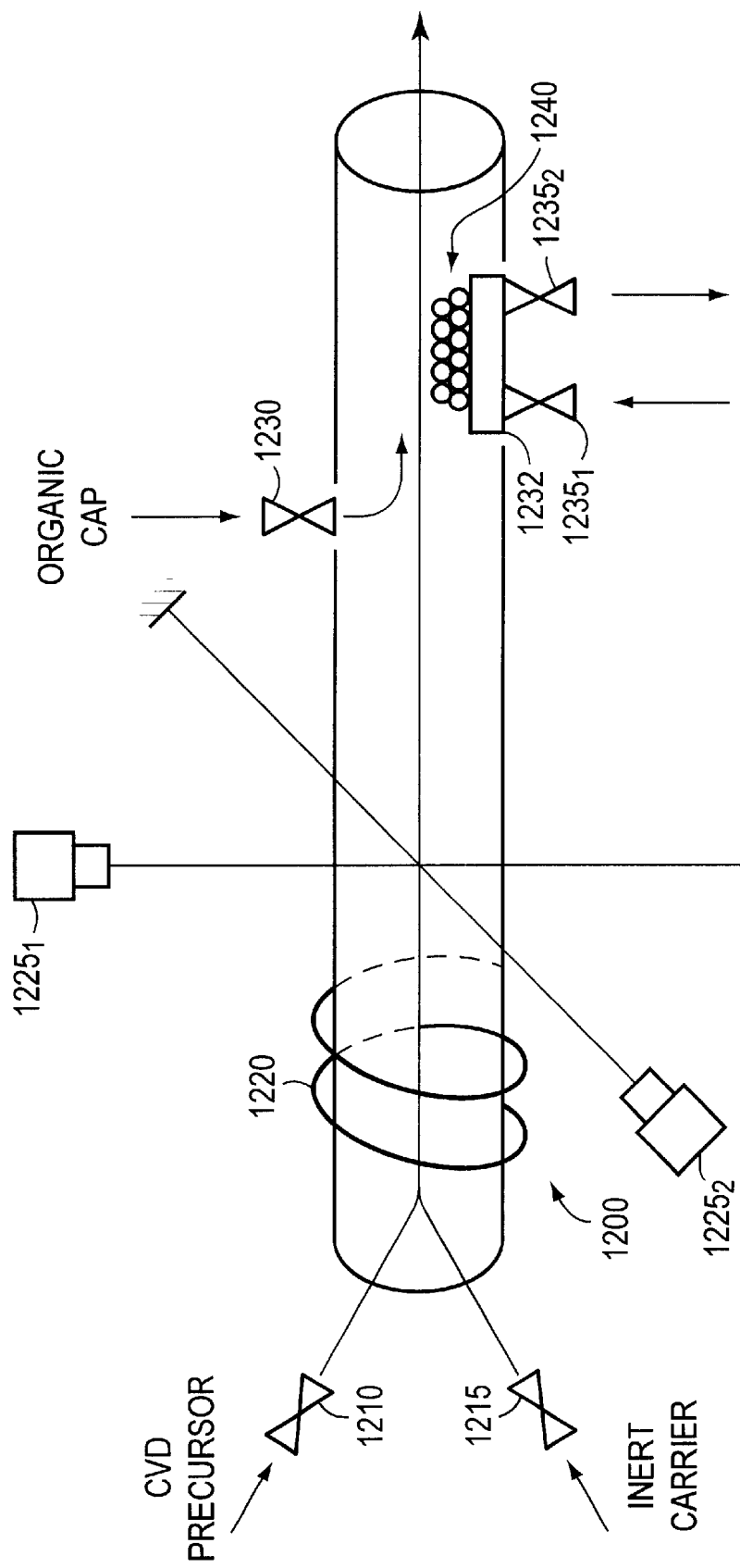
FIGS. 12A and 12B schematically illustrate alternative configurations for synthesizing nanoparticles.
Figure 12B:
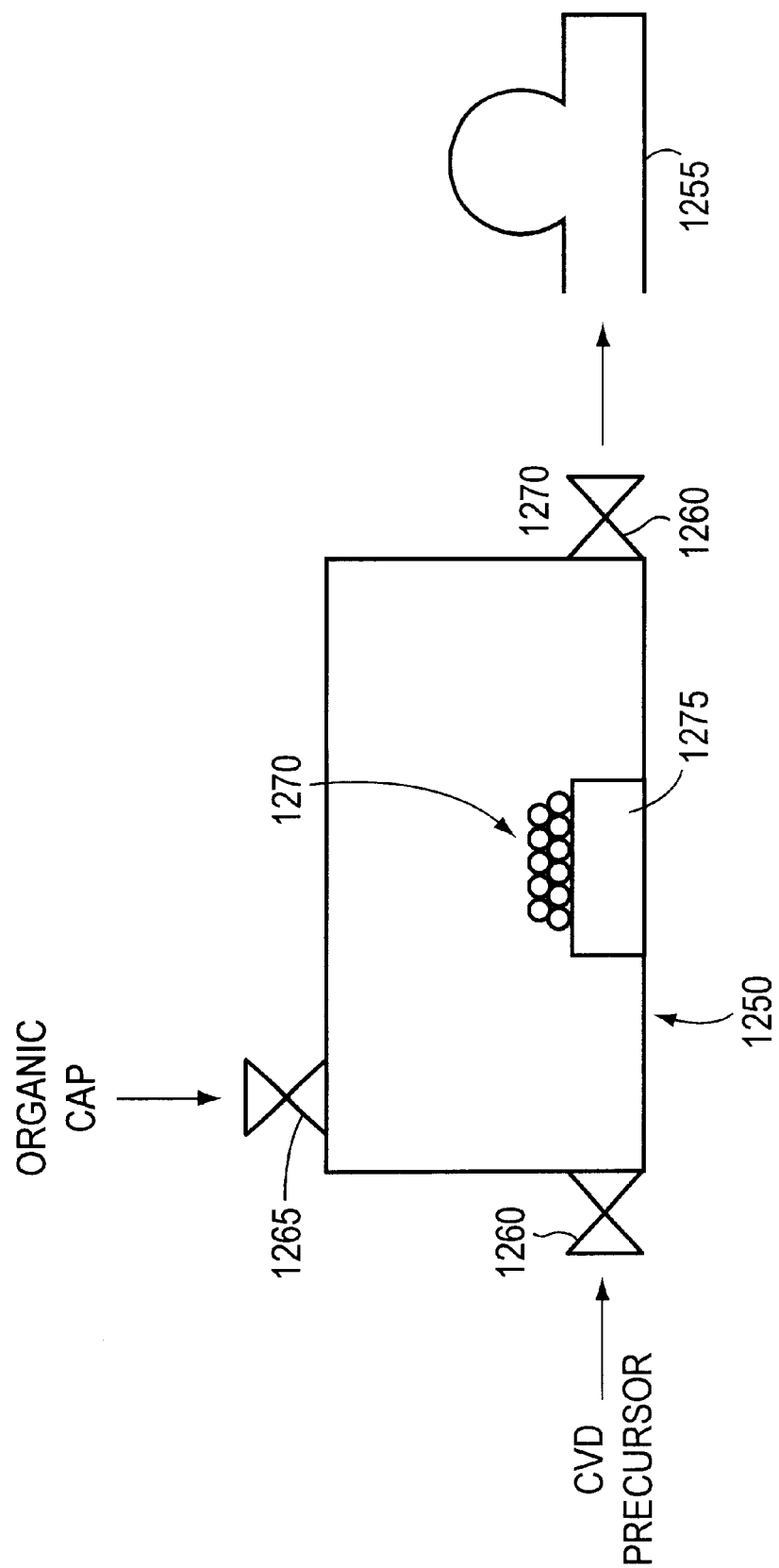

Nanoparticles in solution for use with the present invention may be fabricated using a process similar to chemical vapor deposition (CVD), alternative configurations for which are illustrated in FIGS. 12A and 12B. With reference to FIG. 12A, controlled flows of a CVD precursor gas and an inert carrier gas are introduced into a heated vacuum chamber 1200 through respective mass-flow controllers 1210, 1215. The chamber 1200 is generally tubular in shape and is heated by a surrounding resistive coil. The wall of chamber 1200 is substantially transparent to radiation from a pair of orthogonally oriented lasers $1225_1$, $1225_2$. The organic capping material is introduced in vapor form into chamber 1200, downstream of lasers $1225_1$, $1225_2$, by means of a flow controller 1230. A collecting table 1232 is disposed within chamber 1200 still further downstream, and is chilled by recirculation of a cooling fluid through a pair of valves $1235_1$, $1235_2$. Gaseous material is drawn through chamber 1200 in the direction of the arrow by a vacuum source (not shown).

As the CVD precursor travels through chamber 1200, it is dissociated by a combination of the elevated temperature in the chamber and energy imparted by lasers $1225_1$, $1225_2$. The respective concentrations of CVD precursor and inert carrier are chosen such that mean free path of the chemically pure, dissociated elements or molecules permits, on a probabilistic basis, only hundreds of collisions with other like species before the organic vapor introduced through flow controller 1230 is encountered. With each collision, more and more of the dissociated species come together, thereby forming larger particles. Capping this growing particle with an organic shell prevents it from further increasing in size. The inert gas carries the growing particles from the dissociation region to the capping region at a known rate, and once capped, the particles are collected on chilled collecting table 1232. The carrier gas and unreacted precursor exit the chamber 1200. The resulting nanoparticles 1240, in the form of a paste on the plate 1232, are then removed from the vacuum chamber and put into solution. The solution is subjected to gravity or centrifuging, and the nanoparticles of the smallest size are skimmed off the top.

Suitable CVD precursors include silane, TIBA (triisobutyl-Al), $WF_6$, and $Cu(hfac)_2$ (i.e., copper hexafluoroacetylacetonate) with helium and argon as inert carrier gasses. Suitable organic capping groups include straight-chain alkyl groups that chemically bond to the particle, or groups that interact with the particle surface through a heteroatom such as sulfur, oxygen, nitrogen, or silicon. Other suitable organics, as disclosed in U.S. Pat. No. 5,750,194, include alphaterpineol, methyl oleate, butyl acetate, glyceride linoleate, glyceride linolenate, glyceride oleate, citronellol, geraniol, phenethyl alcohol, and nerol.

As shown in FIG. 12B, the use of more reactive species justifies a simpler configuration that may include a vacuum chamber 1250, which is evacuated by a vacuum pump 1260 operating through a valve 1260. A CVD precursor gas and an organic capping group in vapor form are introduced into vacuum chamber 1250 through respective mass-flow controllers 1260, 1265. The CVD precursor quickly agglomerates into particles, and is capped by the organic vapor. The particles 1270 collect on a chilled table 1275, and are collected as described above.

Although the present invention has been described with reference to specific details, it is not intended that such details should be regarded as limitations upon the scope of the invention, except as and to the extent that they are included in the accompanying claims.

What is claimed is:

1. A method of fabricating a functional component, the method comprising:
   a. providing a thin film of curable liquid material in liquid form;
   b. patterning the curable material by embossing the material at low pressure with an elastomeric stamp having a raised pattern thereon;
   c. curing the patterned material to form a cured layer; and
   d. repeating (a) to (c) with a plurality of materials to form a plurality of cured layers which have varying functional characteristics, the plurality of cured layers interacting so as to produce the functional component.

2. The method of claim 1 wherein the stamp comprises an elastomeric polymeric matrix with a rigidity-conferring material entrained therein.

3. The method of claim 1 further comprising the step of forming the elastomeric stamp by:
   a. creating a negative impression of the pattern in a substrate;
   b. enclosing the pattern;
   c. pouring a liquid elastomeric precursor into the enclosure, the precursor flowing into the negative impression of the pattern
   d. curing the elastomeric precursor into an elastomer; and
   e. removing the elastomer from the substrate.

4. The method of claim 1 further comprising the step of forming the elastomeric stamp by:
   a. providing a photosensitive elastomer;
   b. exposing the elastomer to actinic radiation so as to render the pattern; and
   c. photochemically developing the exposed elastomer to produce the pattern.

5. The method of claim 1 further comprising cleaning the stamp by applying a curable polymer thereto, curing the curable polymer, and removing the cured polymer from the stamp.

6. The method of claim 1 wherein the curable material is applied as a liquid.

7. The method of claim 6 wherein the liquid is applied onto a smooth, flat support as a bead and drawn into a uniform film.

8. The method of claim 1 wherein the curable material is applied as a non-liquid and subsequently liquefied.

9. The method of claim 8 wherein the material is applied to a support and liquefied by heating the support.

10. The method of claim 8 wherein the material is liquefied by heating the stamp.

11. The method of claim 1 wherein the raised pattern comprises convex surfaces.

12. The method of claim 1 wherein the stamp is applied to the patterned material and removed therefrom with a rocking motion.

13. The method of claim 1 wherein the material is present on a support and is at least partially cured with the stamp held against the support.

14. The method of claim 1 wherein the stamp is removed from the material prior to curing the material, the material retaining the pattern despite removal of the stamp.

15. The method of claim 1 wherein the material is present on an uneven surface, the stamp patterning the material without substantial lateral deflection.

16. The method of claim 1 wherein the material is present on an uneven surface, the stamp having unraised portions which, with raised features of the stamp in contact with the surface, planarize the material in contact with the unraised portions.

17. The method of claim 1 wherein a plurality of contiguous layers is patterned with elastomeric stamps at least some of which have different patterns, at least some of the stamps having raised features in common locations to create vias between non-adjacent layers.

18. The method of claim 17 wherein at least some of the vias extend through a plurality of layers.

19. The method of claim 17 wherein the vias are filled by deposited material forming one of the layers, said material being planarized as said layer is patterned.

20. The method of claim 1 wherein the material of at least one of the cured layers is a suspension of nanoparticles in a carrier liquid.

21. The method of claim 20 wherein the material is cured by evaporating the carrier liquid, the nanoparticles coalescing into a substantially continuous patterned film.

22. The method of claim 21 wherein the nanoparticles are metal, the film being conductive.

23. The method of claim 21 wherein the nanoparticles are semiconductive, the film being semiconductive.

24. The method of claim 1 wherein at least one of the cured layers is soluble in a solvent, and further comprising removing the at least one cured layer by exposure of the component to the solvent.

25. The method of claim 1 wherein, for each cured layer, the stamp is applied at a plurality of locations to produce a two-dimensional repetitive pattern.

26. The method of claim 1 wherein steps (a) to (d) are repeated a plurality of times so that the cured layers are formed repetitively.

27. The method of claim 1 wherein application of the stamp to the thin film results in adherence of material to the raised stamp pattern, the embossing step comprising transferring the adhered material to a substrate for curing.

28. The method of claim 27 wherein transfer is accomplished by application of low pressure to the stamp.

29. The method of claim 1 wherein the thin film is formed by deposition of the curable material in droplet form followed by application of the stamp thereto so as to form a thin film having a pattern complementary to the stamp pattern.

30. The method of claim 1 wherein the functional component is a micromechanical structure.

31. The method of claim 1 wherein the functional component is an integrated circuit, the cured layers comprising conducting, dielectric, and semiconducting layers.

32. The method of claim 1 wherein the functional component is a biochip.

33. The method of claim 1 wherein the functional component is a field-emission display.

34. The method of claim 33 wherein the curable material is a suspension of metal nanoparticles and carbon nanotubes and the pattern comprises first and second sets of interdigitated lines having nanotubes protruding therefrom, the repeating steps comprising applying a suspension of metal nanoparticles so as to cover the first set of interdigitated lines and curing the metal-nanopartic suspension thereover.

35. The method of claim 1 wherein the functional component is an optical waveguide.

36. A method of fabricating a functional component, the method comprising the steps of:
 a. providing a thin film of a liquid on a support;
 b. patterning the liquid by embossing it at low pressure with an elastomeric stamp having a first raised pattern thereon, the raised pattern displacing the liquid when brought into contact with the support; and
 c. bringing into contact with the support a substrate having thereon a second raised pattern, the liquid, where present on the support, adhering to the second raised pattern.

37. The method of claim 36 wherein the liquid comprises a biological material.

38. The method of claim 36 wherein the liquid comprises a biological resist, and further comprising exposing the substrate to a biological material, the biological material not adhering to portions of the substrate that have received the resist.

39. A method for making a multi-layer structure comprising:
 a. depositing a first liquid layer;
 b. patterning the first liquid layer with a first stamp to form a first patterned liquid layer;
 c. curing the first patterned liquid layer to form a first device layer;
 d. depositing a second liquid layer over a portion of the first device layer;
 e. patterning the second liquid layer with a second stamp to form a second patterned liquid layer; and
 f. curing the second patterned liquid layer to form a second device layer.

40. The method of claim 39, wherein at least one of the first device layer and the second device layer is conductive.

41. The method of claim 39, wherein at least one of the first device layer and the second device layer is insulating.

42. The method of claim 39, wherein the first device layer is a conductive layer, the second device layer is an insulating layer, the method further comprising depositing a third liquid layer and curing the third liquid layer to form a third device layer.

43. The method of claim 42, wherein the third device layer is a conductive device layer.

* * * * *